(12) United States Patent
Asai et al.

(10) Patent No.: US 6,411,519 B2
(45) Date of Patent: Jun. 25, 2002

(54) PACKAGE SUBSTRATE

(75) Inventors: Motoo Asai; Yoji Mori, both of Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/905,974

(22) Filed: Jul. 17, 2001

Related U.S. Application Data

(62) Division of application No. 09/529,597, filed as application No. PCT/JP98/04350 on Sep. 28, 1998.

(30) Foreign Application Priority Data

Oct. 17, 1997 (JP) .............................. 9-303694
Oct. 29, 1997 (JP) .............................. 9-312686
Oct. 29, 1997 (JP) .............................. 9-312687
Nov. 28, 1997 (JP) .............................. 9-343815
Dec. 10, 1997 (JP) .............................. 9-361947

(51) Int. Cl.$^7$ ............................ H05K 1/11; H05K 1/14
(52) U.S. Cl. ..................... 361/794; 361/764; 361/784; 361/780; 361/777; 174/255; 174/264; 174/262
(58) Field of Search ................... 361/794, 784, 361/795, 760, 761, 762, 764, 767, 774, 777, 778, 779, 780; 174/262, 263, 264, 255, 250

(56) References Cited

U.S. PATENT DOCUMENTS 5,535,101 A * 7/1996 Miles et al. ............... 367/808
6,128,633 A * 10/2000 Kinoshita ................. 174/259

FOREIGN PATENT DOCUMENTS

| EP | 1 030 365 A1 | 8/2000 |
|---|---|---|
| JP | 7-66552 A | 3/1995 |
| JP | 8-8359 A | 1/1996 |
| JP | 8-32240 | 2/1996 |
| JP | 09-102678 | 4/1997 |
| JP | 09-298364 | 11/1997 |

* cited by examiner

Primary Examiner—David Martin
Assistant Examiner—Hung Bui
(74) Attorney, Agent, or Firm—Pillsbury Winthrop LLP

(57) ABSTRACT

According to the package board of the present invention, each soldering pad formed on the top surface of the package board, on which an IC chip is to be mounted, is small (133 to 170 μm in diameter), so the metallic portion occupied by the soldering pads on the surface of the package board is also small. On the other hand, each soldering pad formed on the bottom surface of the package board, on which a mother board, etc. are to be mounted, is large (600 μm in diameter), so the metallic portion occupied by the soldering pads on the surface of the package board is also large. Consequently, a dummy pattern 58M is formed between conductor circuits 58U and 58U for forming signal lines on the IC chip side surface of the package board thereby to increase the metallic portion on the surface and adjust the rate of the metallic portion between the IC chip side and the mother board side of the package board, protecting the package board from warping in the manufacturing processes, as well as during operation.

4 Claims, 24 Drawing Sheets

Fig. 3
(A)
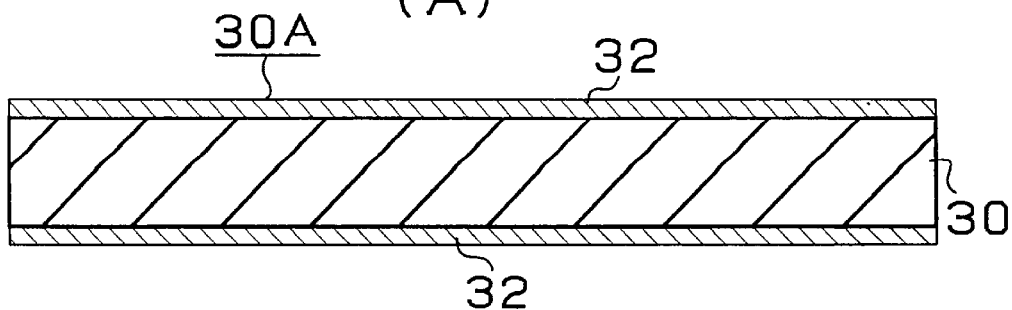
(B)
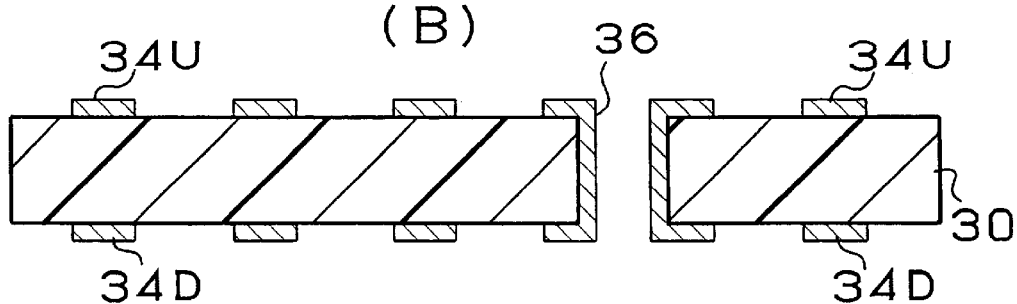
(C)
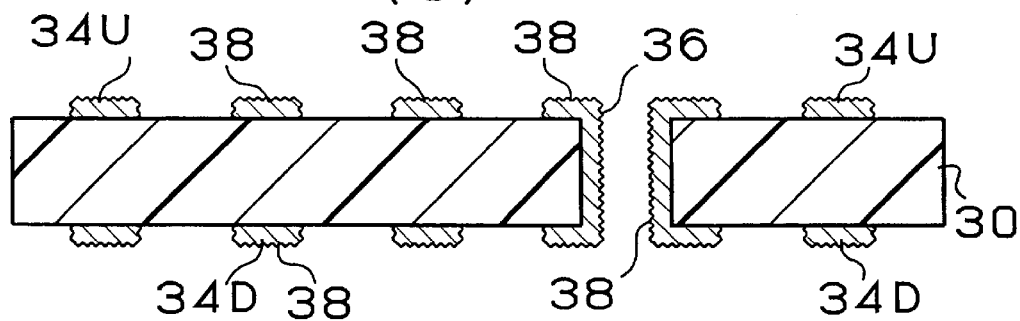
(D)
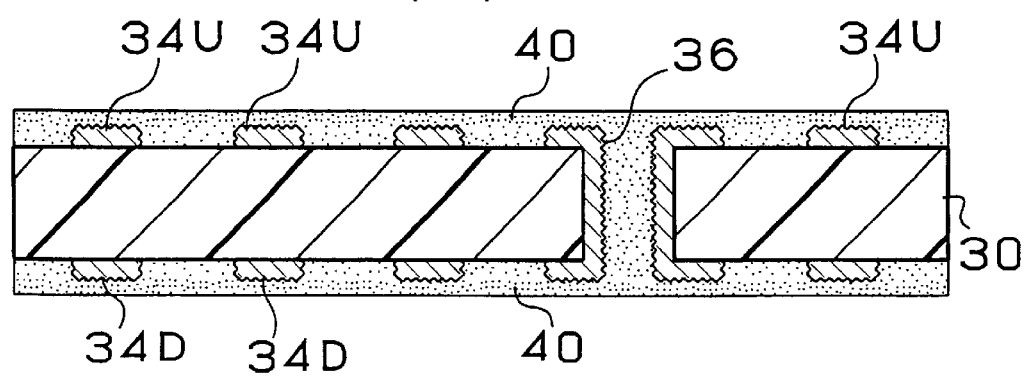

Fig. 4
(E)
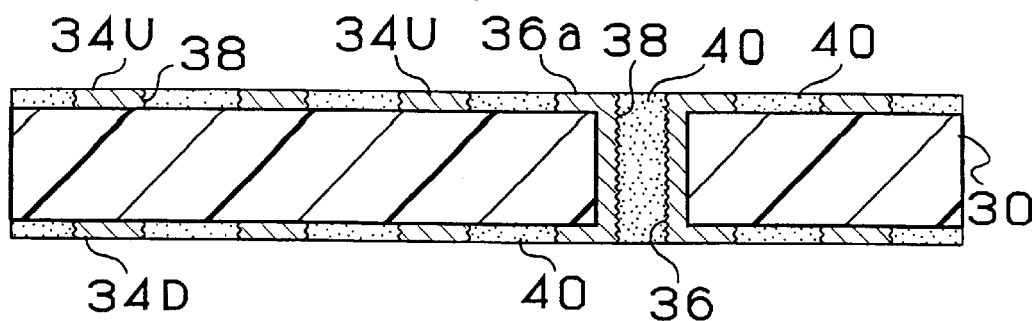
(F)
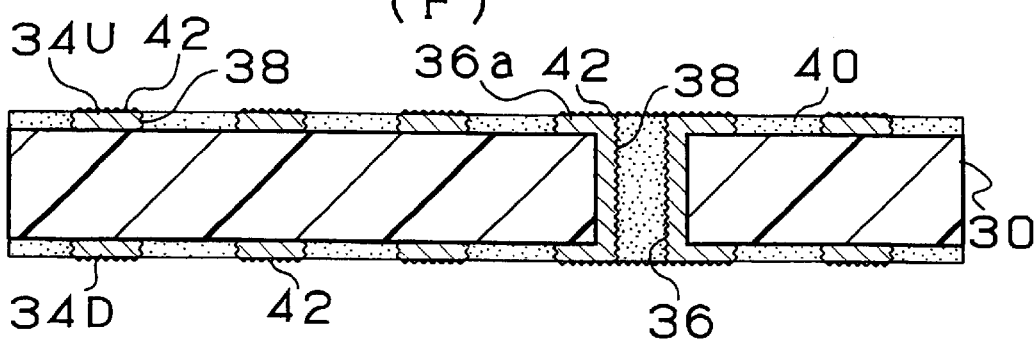
(G)
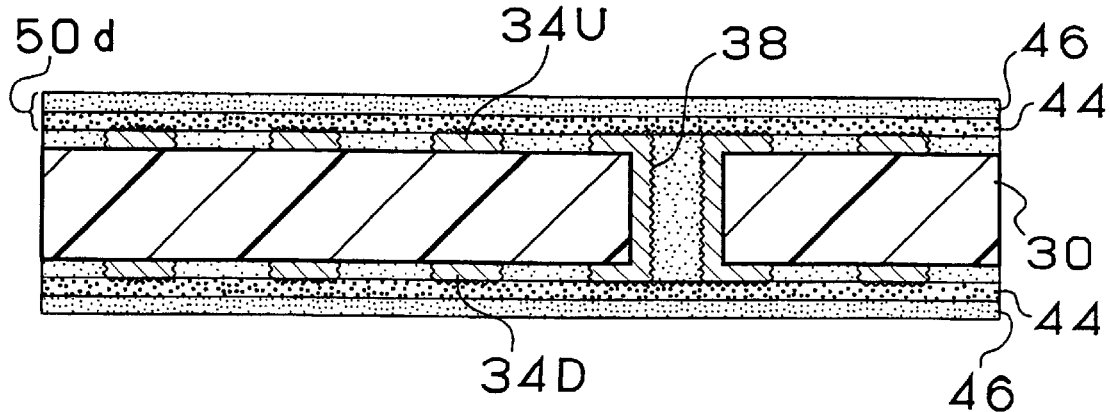

Fig.5
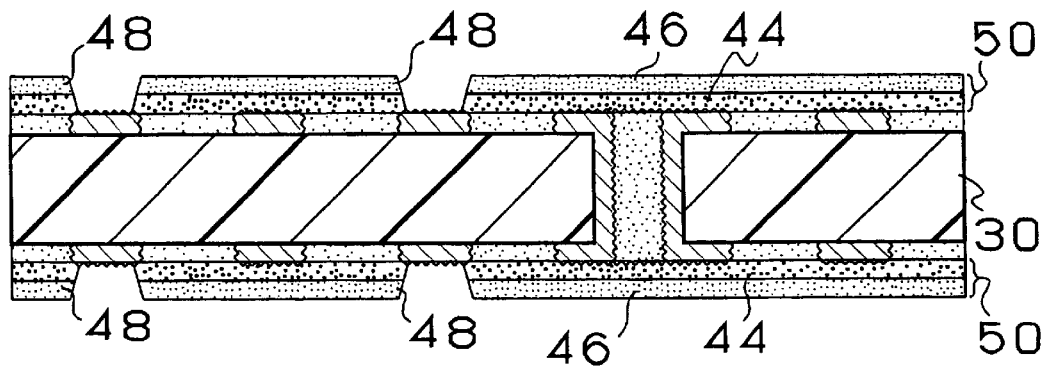
(H)
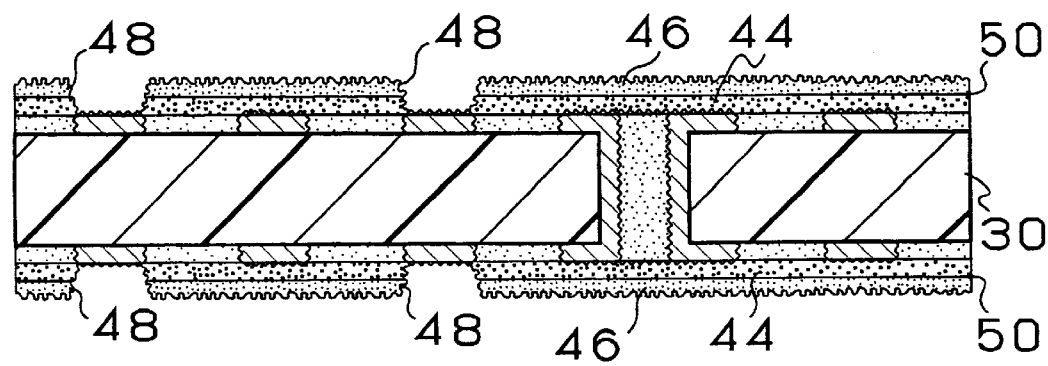
(I)
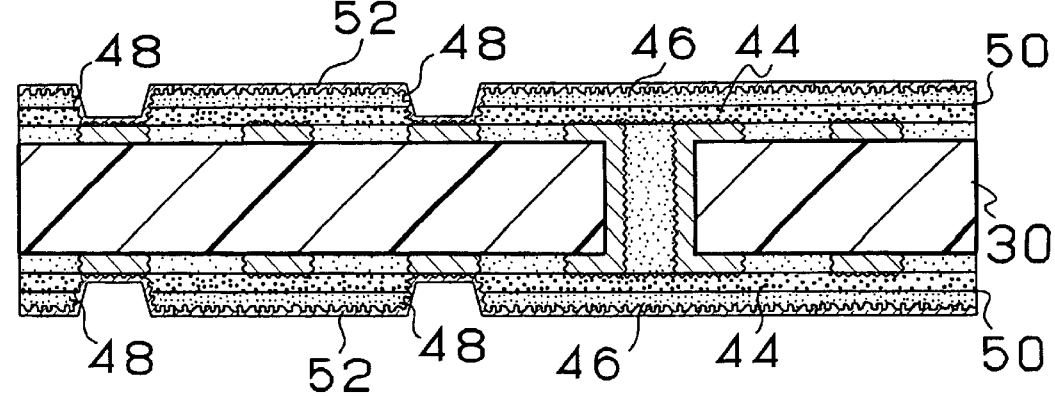
(J)

Fig. 6
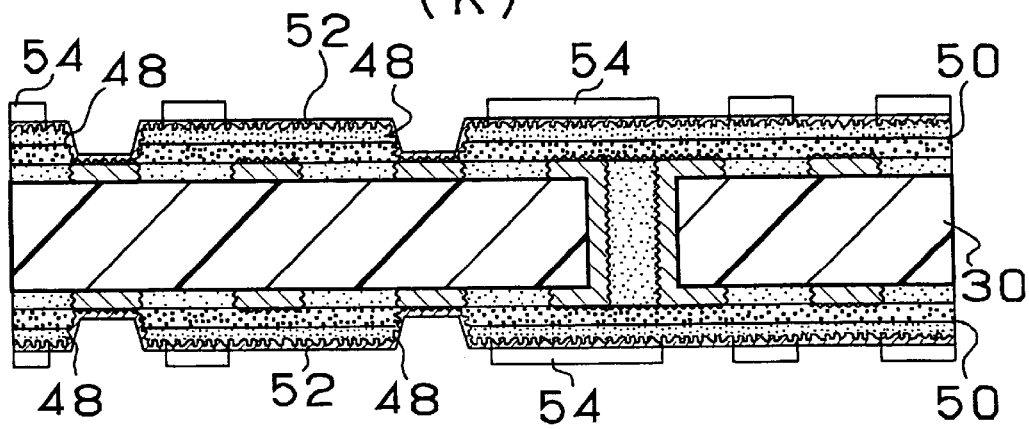
(K)
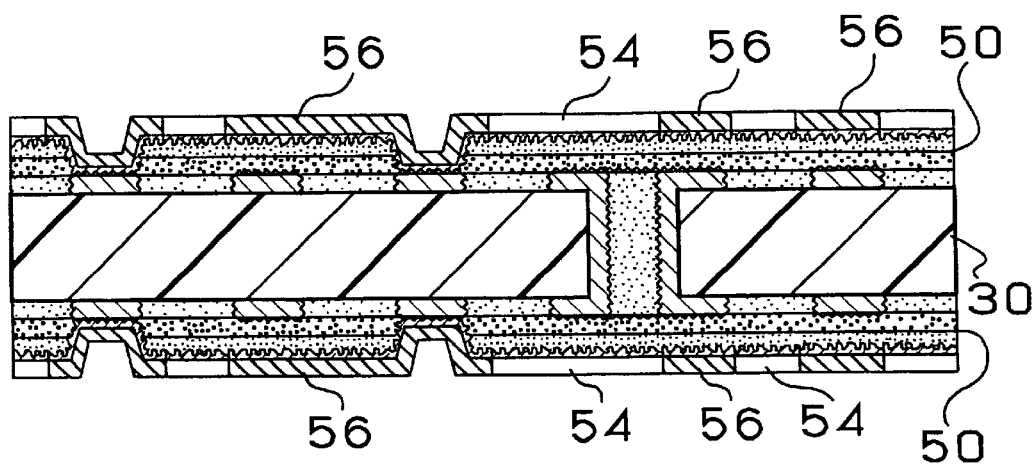
(L)
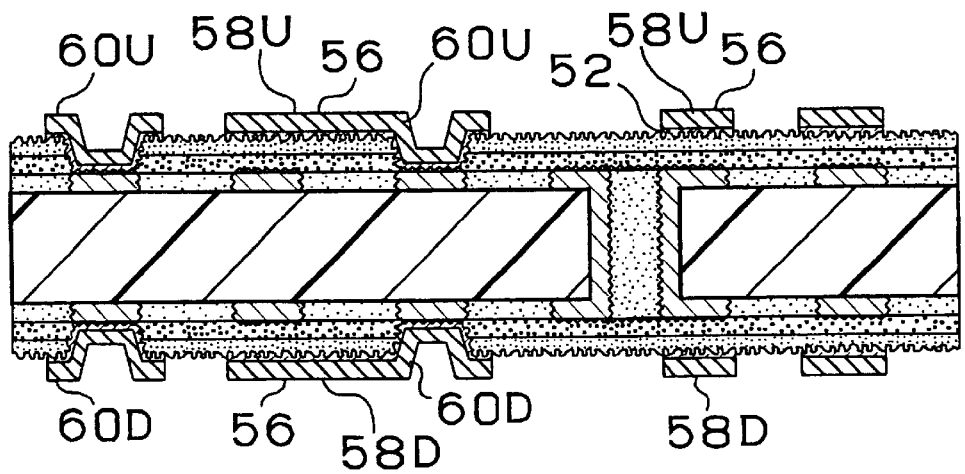
(M)

Fig. 7
(N)
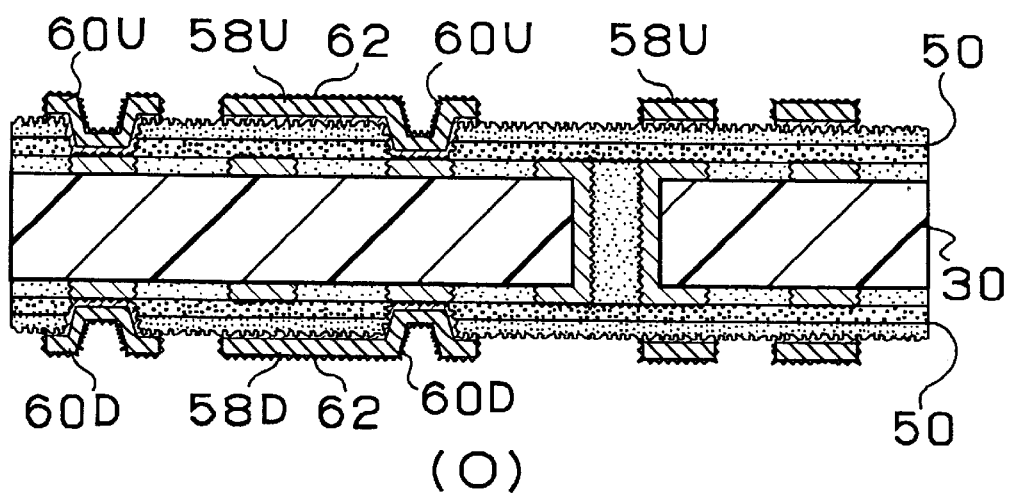
(O)
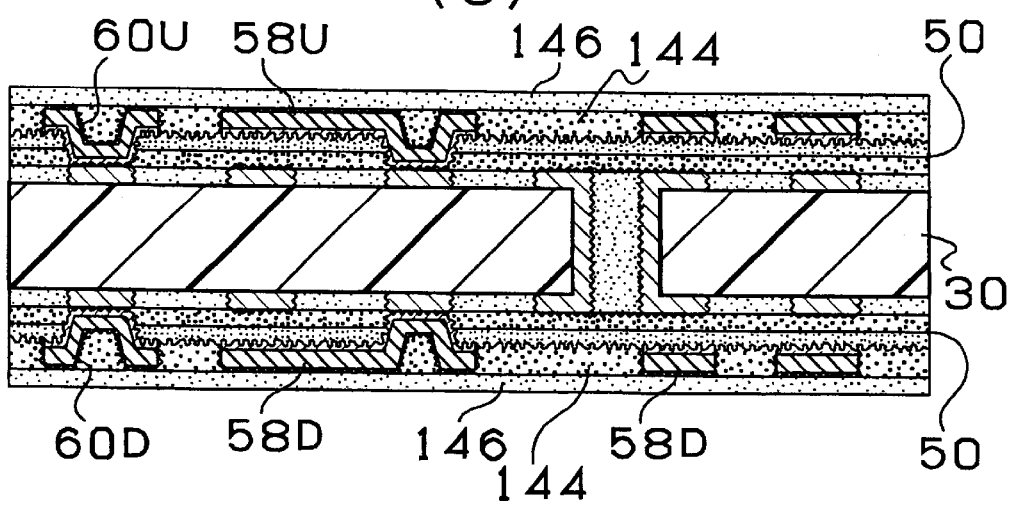
(P)
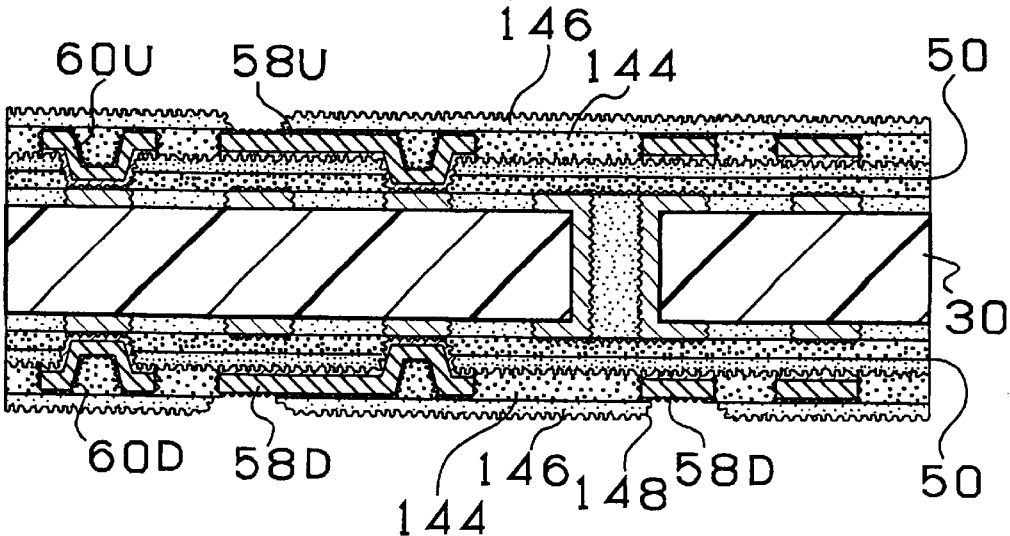

Fig.9
(T)
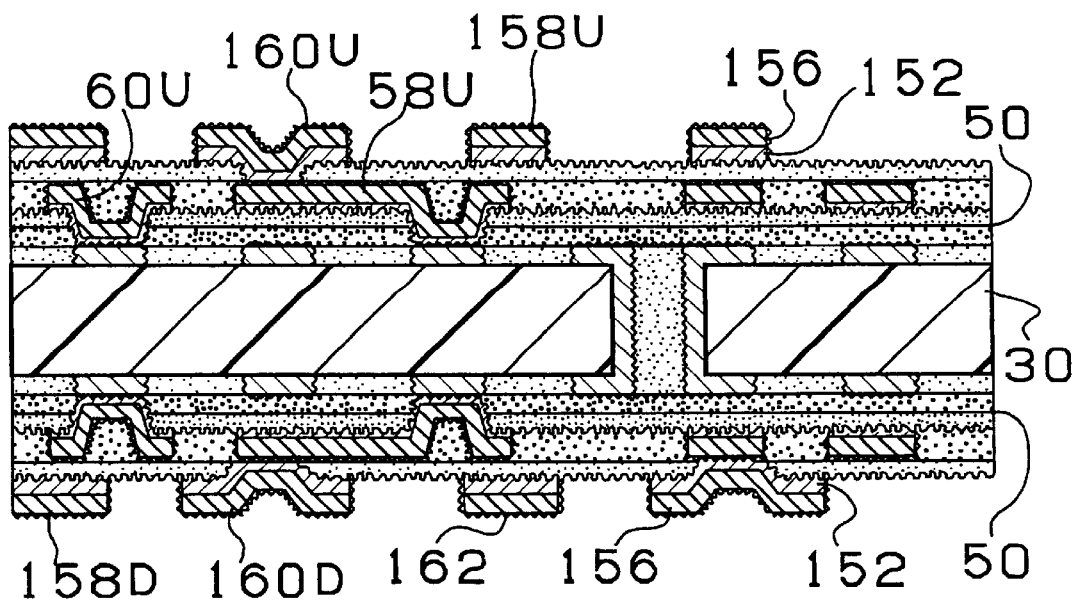
(U)
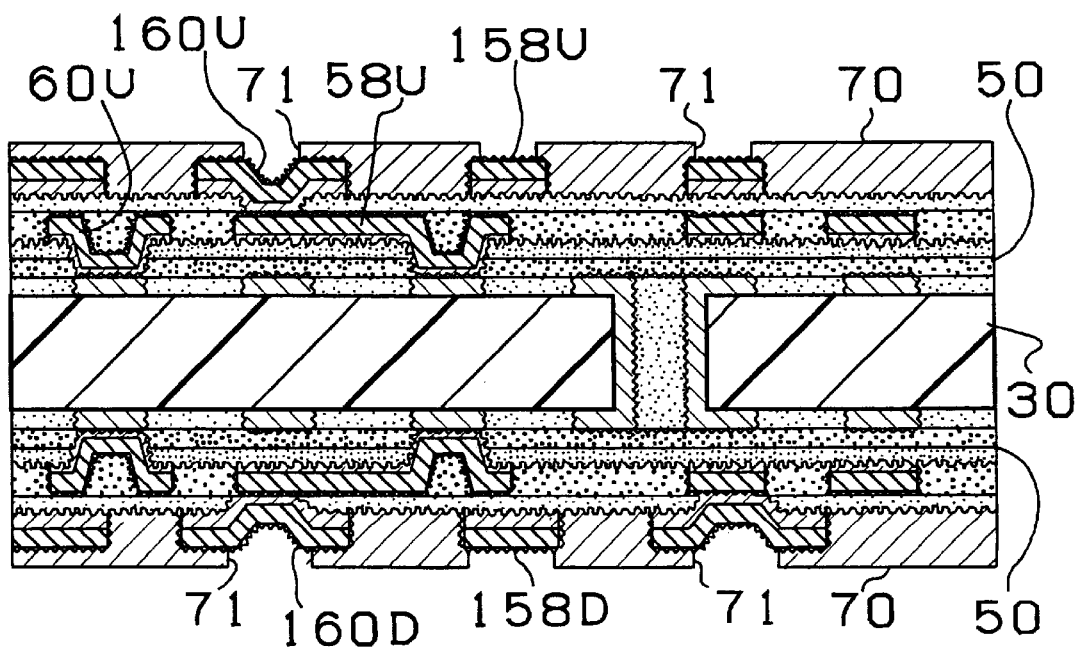

Fig. 11
(A)
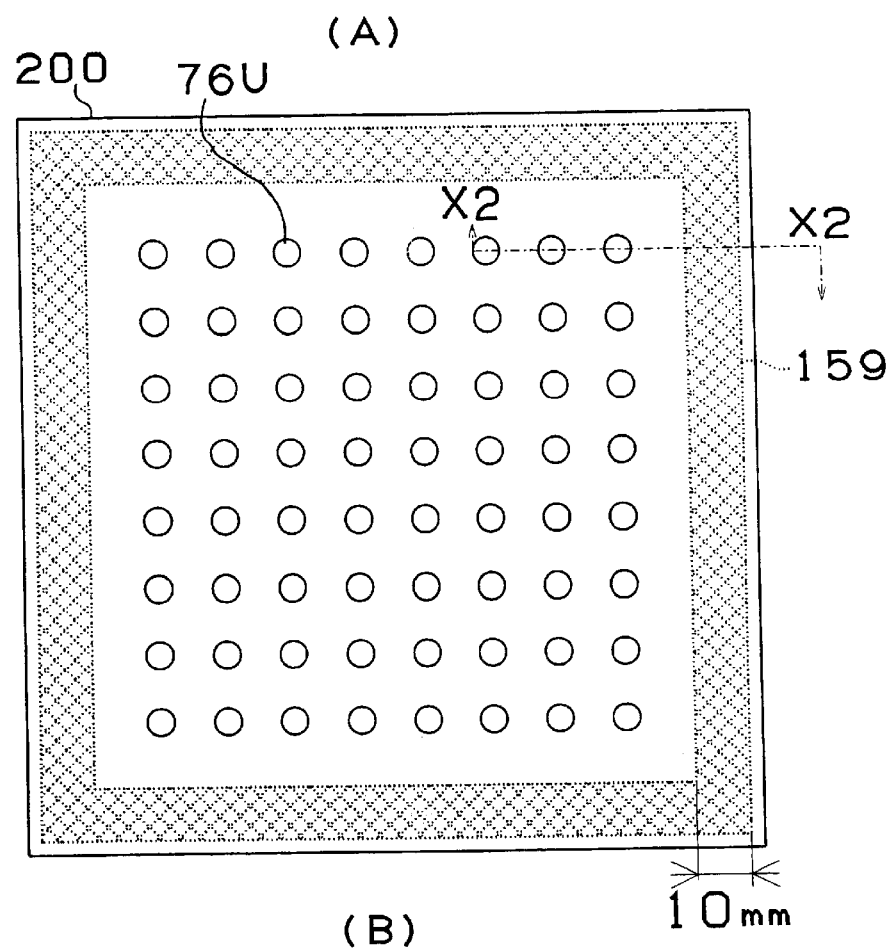
(B)
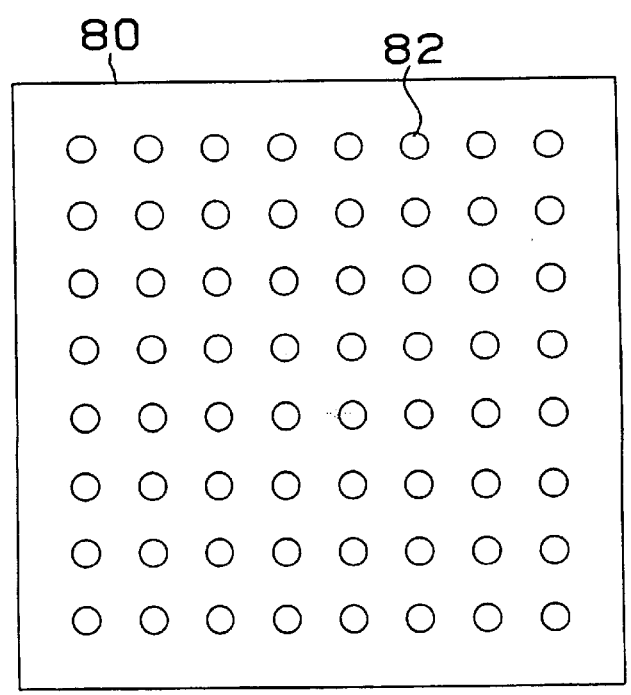

Fig. 16
(A)
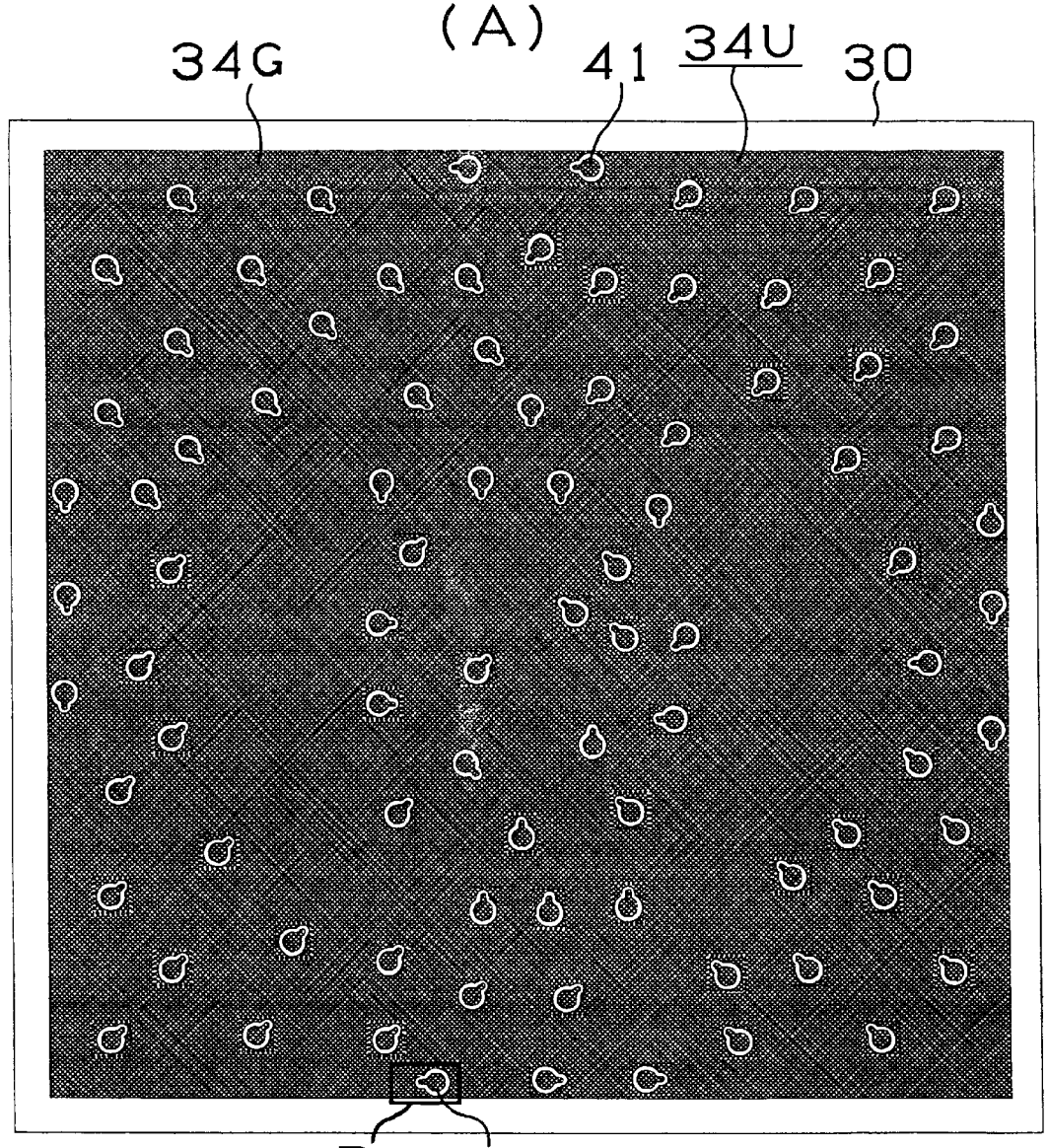
(B)
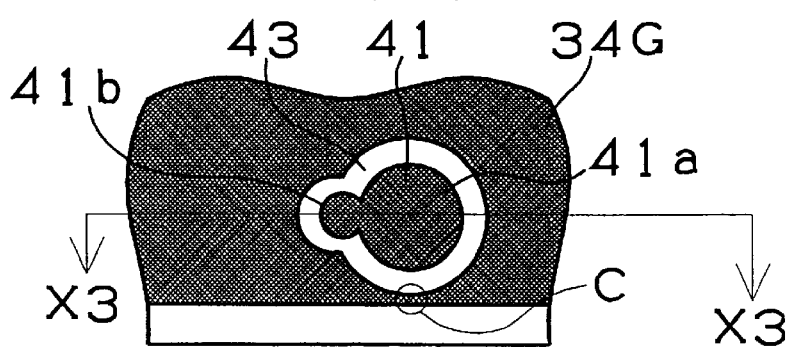

Fig.18
(A)
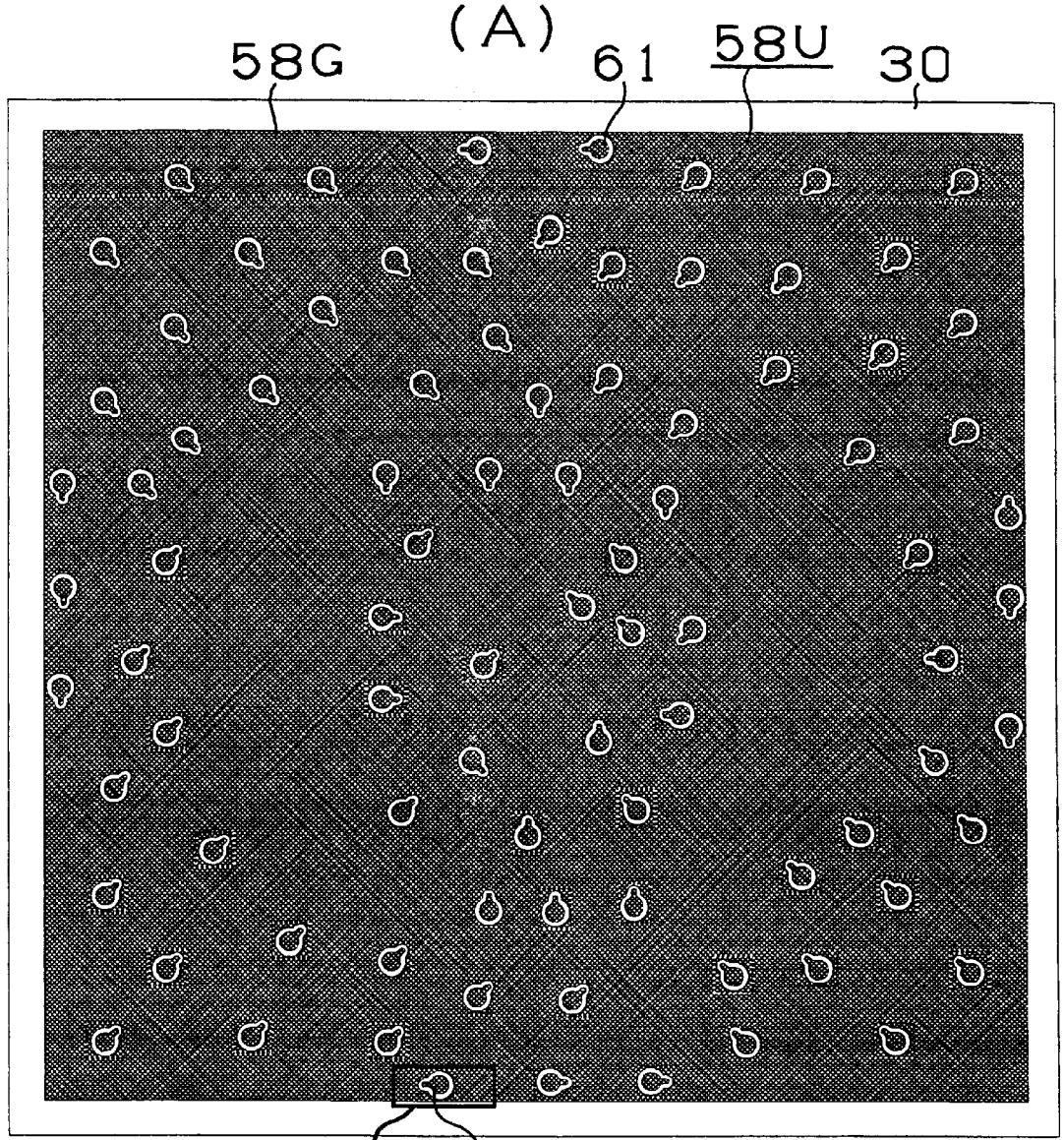
(B)
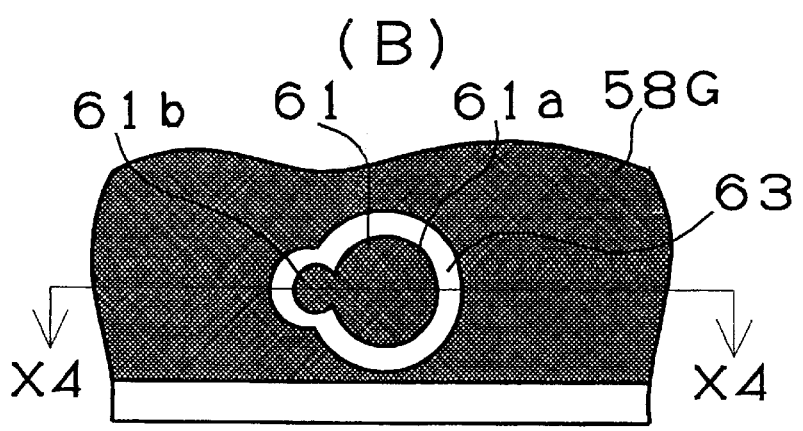

Fig.24
(A)
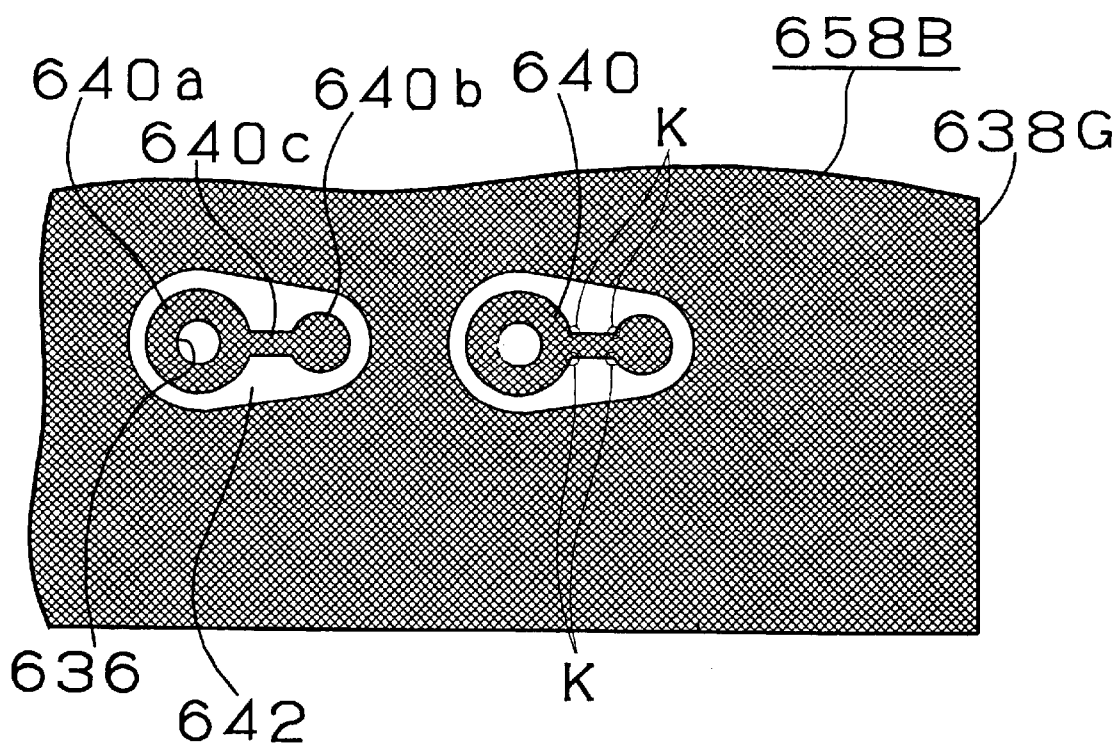
(B)
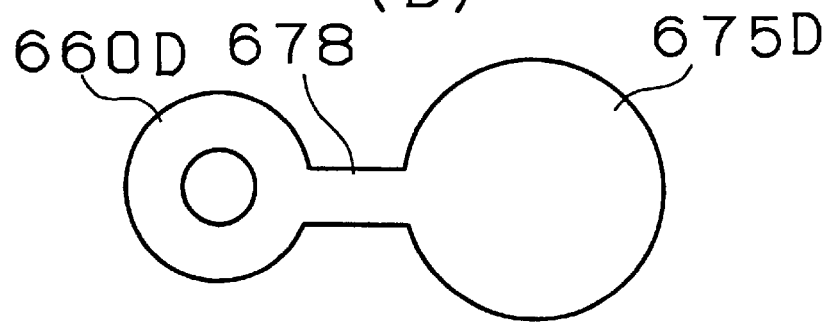
(C)
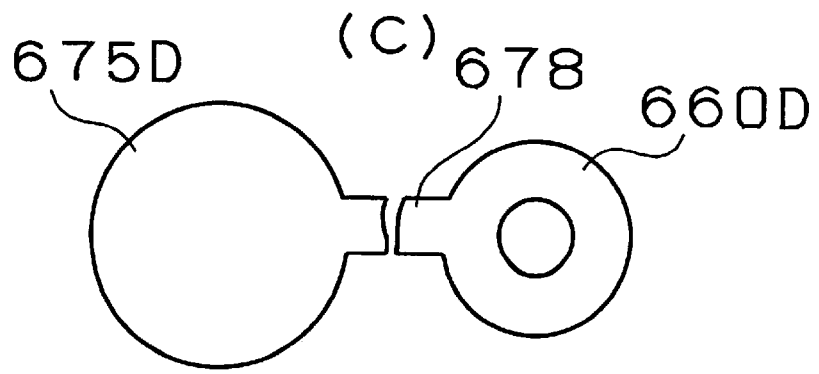

PACKAGE SUBSTRATE

This is a Divisional of National Application Ser. No. 09/529,597 filed May 31, 2000, which is the National Phase under 35 U.S.C. §371 of International Application No. PCT/JP98/04350, filed Sep. 28, 1998.

BACKGROUND ART

The present invention relates to a package board on which an IC chip is to be mounted, more particularly, a package board provided with soldering pads on its top and bottom surfaces. The soldering pads are connected to the IC chip, as well as to boards such as a mother board, a sub-board, etc.

A highly integrated IC chip is mounted on the package board and connected to a mother board, a sub-board, etc. Hereunder, a configuration of this package board will be described with reference to FIG. 23, which is a cross sectional view of the package board 600 provided with an IC chip 80 and mounted on a mother board 90. The package board 600 includes conductor circuits 658A and 658B formed on both surfaces of its core board 630. Furthermore, conductor circuits 658C and 658D are formed in the upper layer of the conductor circuits 658A and 658B with an interlaminar resin insulating layer 650 therebetween respectively. On the upper layer of the conductor circuits 658C and 658D is formed an interlaminar resin insulator 750. In the interlaminar resin insulating layer 650 are formed via-holes 660A and 660B and in the interlaminar resin insulator 750 are formed via-holes 660D and 660C respectively. On the other hand, on the top surface of the package board on which the IC chip 80 is mounted are formed soldering bumps 676U connected to the pads 82 formed on the IC chip 80 side surface of the package board. On the bottom surface of the package board 600 on which a sub-board 90 is mounted are formed soldering bumps 676D connected to the pads 92 formed on the mother board 90 side surface of the package board 600. Each of the soldering bumps 676U is formed on a soldering pad 675U. Each of the soldering bumps 676D is formed on a soldering pad 675D. In order to more improve the connection reliability of the soldering bumps 676U and 676D, resin 84 is sealed in a clearance between the IC chip 80 and the package board 600. In the same way, resin 94 is sealed in a clearance between the package board 600 and the mother board 90.

As described above, the package board 600 is used to connect the highly integrated IC chip 80 to the mother board 90. The pads 82 formed on the IC chip 80 side surface are as small as 133 to 170 μm in diameter and the pads 92 formed on the mother board 90 side surface are as large as 600 μm in diameter. Consequently, the IC chip 80 cannot be attached directly to the mother board 90. This is why the package board 600 is disposed between the IC chip 80 and the mother board 90.

The package board 600 is formed so as to match both IC chip side soldering pads 675U and mother board side soldering pads 675D with both IC chip side pads 82 and mother board side pads 92 in size respectively. Consequently, the rate of the area occupied by the soldering pads 675U on the IC chip side surface of the package board 600 differs from the rate of the area occupied by the soldering pads 675D on the mother board side surface of the package board 600. And, both interlaminar resin insulator 650 and core board 630 are made of resin and the soldering pads 675U and 675D are made of a metallic material such as nickel. Consequently, when the resin portions of the interlaminar resin insulating layers 650 and 750 are shrunk due to curing, drying, etc. in the manufacturing process, the package board is warped toward the IC chip side sometimes. This is because of a difference in the rate of the area occupied by the soldering pads between 675U on the IC chip side surface and 675D on the mother board side surface of the package board 600 as described above. In addition, when in an actual usage of the package board 600 on which an IC chip is mounted, the heat generated from the IC chip makes the package board expand and shrink repetitively, causing a difference of shrinkage factor between the resin portion and the metallic portion of those soldering pads. And, this results in warping of the package board 600 sometimes.

In the case of a multi-layer board used as such a package board, one of a plurality of conductor circuit layers is generally used as a ground layer or a power supply layer to reduce noise or for other purposes. In the case of a multi-layer wiring board manufactured by a conventional technology as shown in FIG. 23, however, the ground layer (or the power supply layer) is connected to an external terminal via a wire. In other words, wires 658A and 658B (conductor circuits) used as ground layers are formed on the upper layer of the board 630. The wiring (ground layer) 658B is connected to the wiring 658D-S through a via-hole 660B and the wiring 658D-S is connected to the soldering bump 676U through a via-hole 660D.

Since the ground layer 658D is connected to the soldering bump 676U via the wiring 658D-S in this case, the wiring 658D-S is apt to generate noise and the noise causes malfunctions in electric elements such as an IC chip connected to the multi-layer wiring board. In addition, such the multi-layer wiring board needs a space for wiring in itself and this makes it difficult to realize higher integrated printed wiring boards.

On the other hand, a package board generally includes capacitors therein used to reduce noise from signals transmitted between the IC chip and the mother board. In an embodiment as shown in FIG. 23, inner layer conductor circuits 658A and 658B provided on both surfaces of the core board 630 are used as a power supply layer and a ground layer, so that capacitors are formed between the core board 630 and the power supply layer and the ground layer respectively.

FIG. 24A is a top view of the inner conductor circuit layer 658B formed on the top surface of the core board 630. On the inner conductor circuit layer 658B are formed a ground layer 638G, as well as land-pads 640 for connecting the top layer to the bottom layer. And, around each of the land-pads 640 is formed an insulating buffer 642.

Each of the land-pads 640 consists of a land 640A of a through-hole 636 of the core board 630 shown in FIG. 23, a pad 640b connected to a via-hole 660A going through the upper interlaminar resin insulating layer 650, and a wire 640c connecting the land 640a to the pad 640b.

In the case of a package board manufactured by the conventional technology, the land 640a is connected to the pad 640b via the wiring 640c. Consequently, the transmission path provided between the upper conductor layer and the lower conductor layer is longer, so that the package board has confronted with problems that the signal transmission slows down and the connecting resistance increases.

Furthermore, as shown in FIG. 24A, a corner K is formed at a joint between the wiring 640c and the land 640a, as well as at a joint between the wiring 640c and the pad 640b respectively. And, stress is concentrated on each of those corners K due to a difference of thermal expansivity between the core board 630/interlaminar resin insulating layer 650 made of resin and the land pad 640 made of a metallic material (copper, etc.). This causes a crack L1 to be generated sometimes in the interlaminar resin insulating layer 650 as shown in FIG. 23, resulting in breaking of a wire in the conductor circuit 658D or the via-hole 660D formed in the interlaminar resin insulating layer 650.

On the other hand, the mother board 90 side soldering bumps 676D are connected to the inner conductor circuit layer 658C through the via-holes 660D, the wiring 678, and the soldering pads 675. FIG. 24B shows an expanded view (C direction) of both via-hole 660D and soldering bump 675D shown in FIG. 23. A soldering bump 675 on which a soldering bump 676D is mounted is formed circularly and connected to a circularly-formed via-hole 660D through the wiring 678.

The IC chip 80 repeats the heat cycle between high temperature during an operation and cooling down up to the room temperature at the end of an operation. Since the thermal expansivity differs significantly between the IC chip 80 made of silicon and the package board 600 made of resin, stress is generated in the package board in the heat cycle, causing a crack L2 to be generated in the sealing resin 94 provided between the package board 600 and the mother board 90. And, such a crack L2 is extended thereby to disconnect the via-hole 660D from the soldering bump 675D of the package board 600 sometimes. In other words, as shown in FIG. 24C for an expanded view (D direction) of the via-hole 660D and the soldering bump 675 shown in FIG. 23, sometimes a crack L2 causes breaking of the wiring 678 connecting the via-hole 660D to the soldering bump 675D on which the soldering bump 676D is mounted.

Under such circumstances, it is an object of the present invention to provide a package board provided with soldering bumps, which can solve the above conventional problems and never be warped.

It is another object of the present invention to provide a multi-layer wiring board and a multi-layer printed wiring board that are not affected by noise easily.

It is also another object of the present invention to provide a package board that can shorten a transmission path formed between the upper conductor wiring layer and the lower conductor wiring layer.

It is also another object of the present invention to provide a package board that will never cause breaking of a wire between soldering bump and via-hole.

In a package board according to a first aspect of the invention, the soldering pads on the IC chip side surface of the package board are small, so the rate of the metallic portion occupied by those soldering pads is also small. On the other hand, the soldering pads on the mother board side surface of the package board are large, so the rate of the metallic portion occupied by those soldering pads is also large. This is why a dummy pattern is formed between conductor circuit patterns on the IC chip side surface of the package board thereby to increase the metallic portion and adjust the rate of the metallic portion between the IC chip side surface and the mother board side surface of the package board so as to protect the package board from warping. The dummy pattern mentioned above does not have any functional meaning such as an electrical connection and a capacitor. It just means a pattern formed mechanically.

In a package board according to a second aspect of the invention, the soldering pads on the IC chip side surface of the package board are small. Thus, the metallic portion occupied by the soldering pads is less than that of the mother board side surface of the package board, where the soldering pads are large and the metallic portion occupied by the soldering pads is large. This is why a dummy pattern is formed at the outer periphery of each conductor circuit on the IC chip side surface of the package board thereby to increase the metallic portion thereon and adjust the rate of the metallic portion on the package board surface between the IC chip side and the mother board side. This metallic dummy pattern is also effective to improve the mechanical strength of the outer periphery of the package board, as well as protect the package board from warping.

In a package board according to a third aspect of the invention, a power supply layer and/or a ground layer is formed as an inner layer conductor circuit formed under an insulating layer that supports the outermost layer conductor circuits. Then, a via-hole is connected directly to the second conductor circuit and a solder bump is formed in the via-hole. It is therefore not necessary to provide a wire for connecting the power supply layer or the ground layer to the soldering bumps. Consequently, the package board is free of any noise to be mixed in wires.

In a package board according to a fourth aspect of the invention, a power supply and/or a ground layer is formed as the second conductor circuit disposed under the second interlaminar resin insulating layer that supports the conductor circuits formed in the outermost layer. A via-hole is connected directly to the second conductor circuit and a soldering bump is formed in the via-hole. It is therefore not necessary to provide a wire for connecting the power supply layer or the ground layer to the soldering bumps. Consequently, the package board is free of any noise to be mixed in wires.

In a package board according to a fifth aspect of the invention, each land and each pad are formed integrally and connected directly to each other without using a wire. It is thus possible to shorten the transmission path provided between upper and lower conductor layers, as well as to reduce the connecting resistance significantly. In addition, since the land and the pad are connected directly to each other without using a wire, no stress is concentrated at a joint between wiring and land, as well as at a joint between wiring and pad. It is thus possible to protect the package board from breaking of a wire to be caused by a crack generated by such concentrated stress.

In a package board according to a sixth aspect of the invention, a soldering bump is formed in a via-hole, so that each soldering bump is connected directly to a via-hole. Therefore, even when the package board is cracked, it is prevented that breaking of a wire occurs between the soldering bump and the via-hole. In other words, the conventional package board, where a soldering pad is connected to a via-hole through a wire and a soldering bump is formed on a soldering pad, cannot avoid crack-caused breaking of a wire connecting via-holes to soldering pads. A soldering bump is thus disconnected from a via-hole due to such a crack generated inside the package board. The package board defined in this aspect of the invention, however, is completely protected from breaking of a wire caused by such a crack.

In a package board according to a seventh aspect of the invention, a soldering bump is formed in a via-hole, so that each soldering bump is connected directly to each via-hole. It is thus possible to prevent breaking of a wire between a soldering bump and a via-hole even when the package board is cracked. Such a soldering bump is also formed in a plurality of via-holes respectively in this case. It is possible to utilize a fail-safe, since the soldering bump can be connected to another via-hole when one of the via-holes is disconnected from the soldering bump. In addition, since a soldering bump is formed on a plurality of via-holes, a soldering bump can be formed larger to each via-hole.

BRIEF DESCRIPTION OF THE DRAWINGS

FIGS. 3 to FIG. 9 illustrate manufacturing processes of the package board in the first embodiment of the present invention.

FIG. 11A is a top view of the package board in the second embodiment and FIG. 11B is a bottom view of an IC chip.

FIG. 16A is a top view of a core board of the package board in the fourth embodiment of the present invention. On the core board is formed an inner layer copper pattern. FIG. 16B is an expanded partial top view of FIG. 16A.

FIG. 18A is a top view of a conductor circuit formed on a package board composed as a variation of the package board in the fourth embodiment of the present invention. FIG. 18B is an expanded partial top view of FIG. 18A.

FIG. 24A is a top view of an inner layer conductor circuit shown in FIG. 23, FIG. 24B is a C-line view of FIG. 23, and FIG. 24C is a D-line view of FIG. 23.

BEST MODE FOR CARRYING OUT THE INVENTION

FIRST EMBODIMENT

Figure 1:
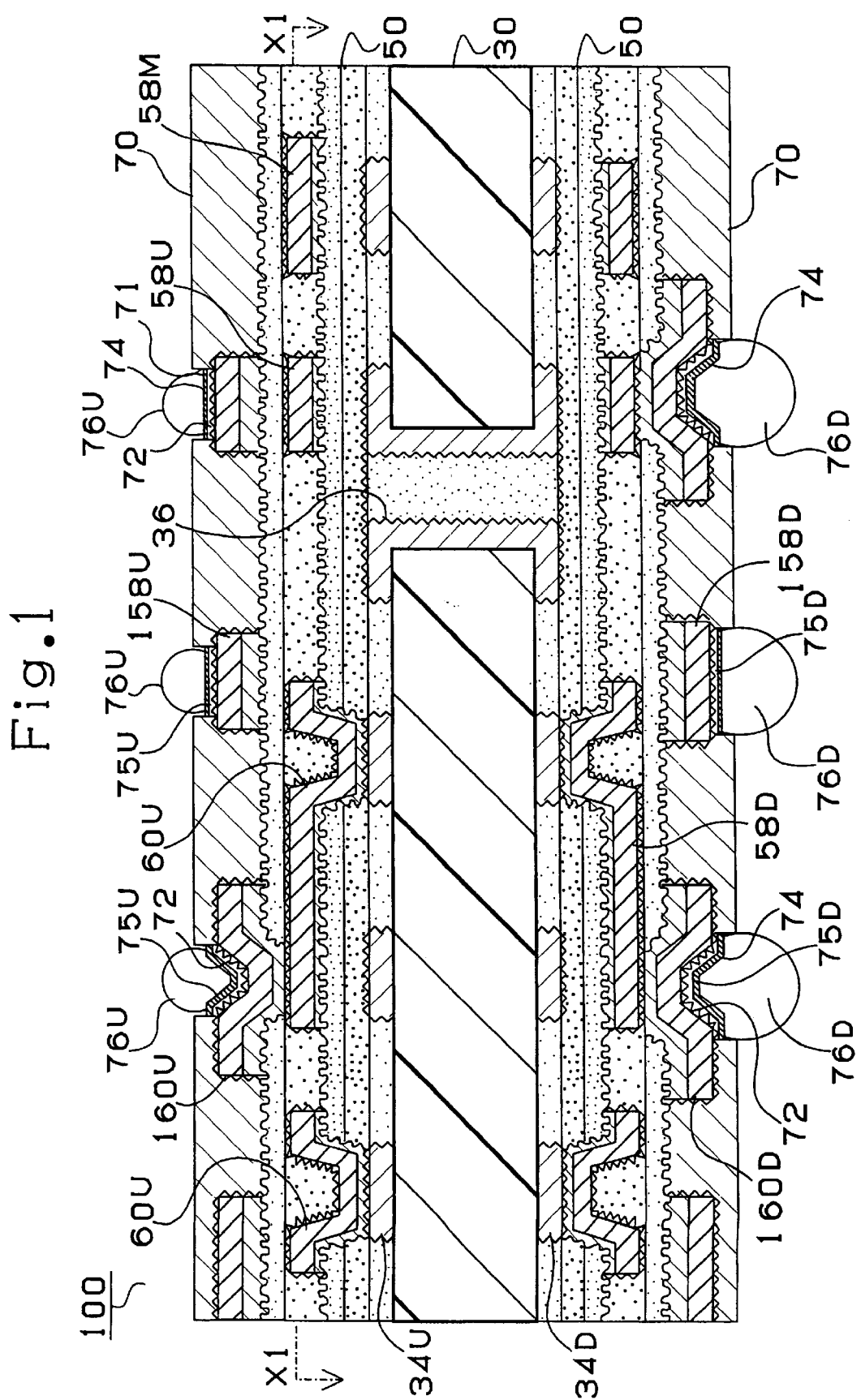
FIG. 1 is a cross sectional view of the package board in a first embodiment of the present invention.

Hereunder, a configuration of the package board in the first embodiment of the present invention will be described with reference to FIG. 1. FIG. 1 shows a cross sectional view of the package board in the first embodiment. The package board in this first embodiment is a so-called IC package provided with an IC (not illustrated) mounted thereon and attached to a mother board (not illustrated). The package board is provided with soldering bumps 76U on its top surface and soldering bumps 76D on its bottom surface. Each of the soldering bumps 76U is connected to a soldering bump of the IC and each of the soldering bumps 76D is connected to a soldering bump of the mother board. Both soldering bumps 76U and 76D are used to pass signals between the IC and the mother board, as well as relay a supply power from the mother board to other parts.

On both top and bottom surfaces of a core board 30 of the package board are formed inner layer copper patterns 34U and 34D, which are used as ground layers. In the upper layer of the inner layer copper pattern 34U is formed a conductor circuit 58U, as well as a dummy pattern 58M for forming a signal line with an interlaminar resin insulating layer 50 therebetween. In addition, a via-hole 60U is formed through the interlaminar resin insulating layer 50. In the upper layer of the conductor circuit 58U and the dummy pattern 58M is formed a via-hole 160U respectively with an interlaminar resin insulating layer 150 therebetween. The via-hole 160U goes through both outermost conductor circuit 158U and interlaminar resin insulating layer 150. And, a soldering pad 75U is formed both in the conductor circuit 158U and in the via-hole 160U. The soldering pad 75U is used to support a soldering bump 76U. Each IC chip side soldering pad 75U is formed so as to be 133 to 170 μm in diameter.

On the other hand, in the upper layer of the ground layer (inner layer copper pattern) 34D formed on the bottom surface of the core board 30 (the upper layer mentioned here means a layer formed on the top surface and the lower layer means a layer formed on the bottom surface of the board 30 respectively) is formed a conductor circuit 58D for forming a signal line with an interlaminar resin insulating layer 50 therebetween. In the upper layer of the conductor circuit 58D is formed a via-hole 160D through both an outermost layer conductor circuit 158D and an interlaminar resin insulating layer 150 with an interlaminar resin insulating layer 150 therebetween. And, a soldering pad 75D is formed both in the conductor circuit 158D and in the via-hole 160D. The soldering pad 75D is used to support a soldering bump 76D. Each mother board side soldering pad 75D is formed so as to be 600 μm in diameter.

Figure 2:
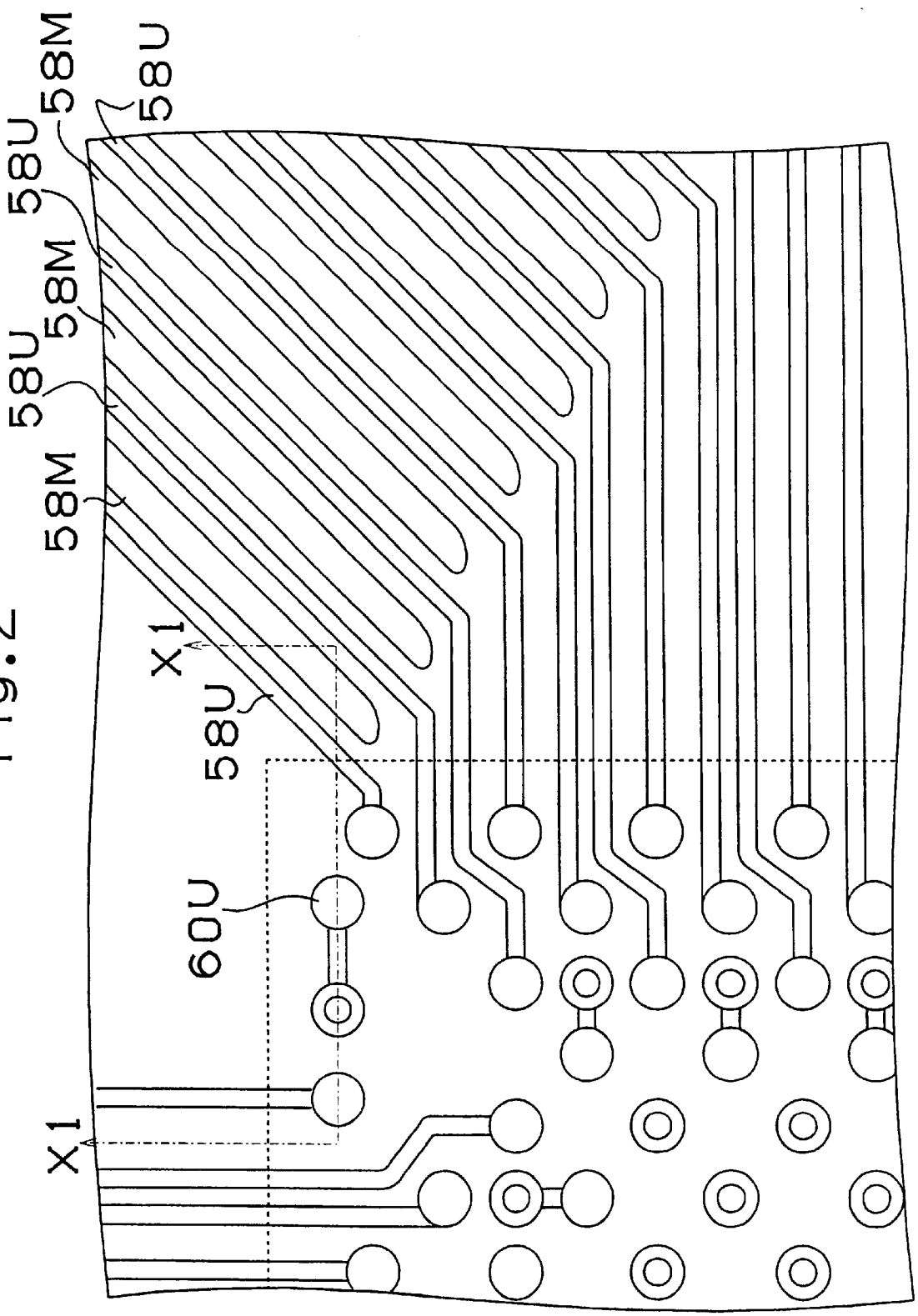
FIG. 2 is an X1—X1 line cross sectional view of the package board shown in FIG. 1.
Figure 8:
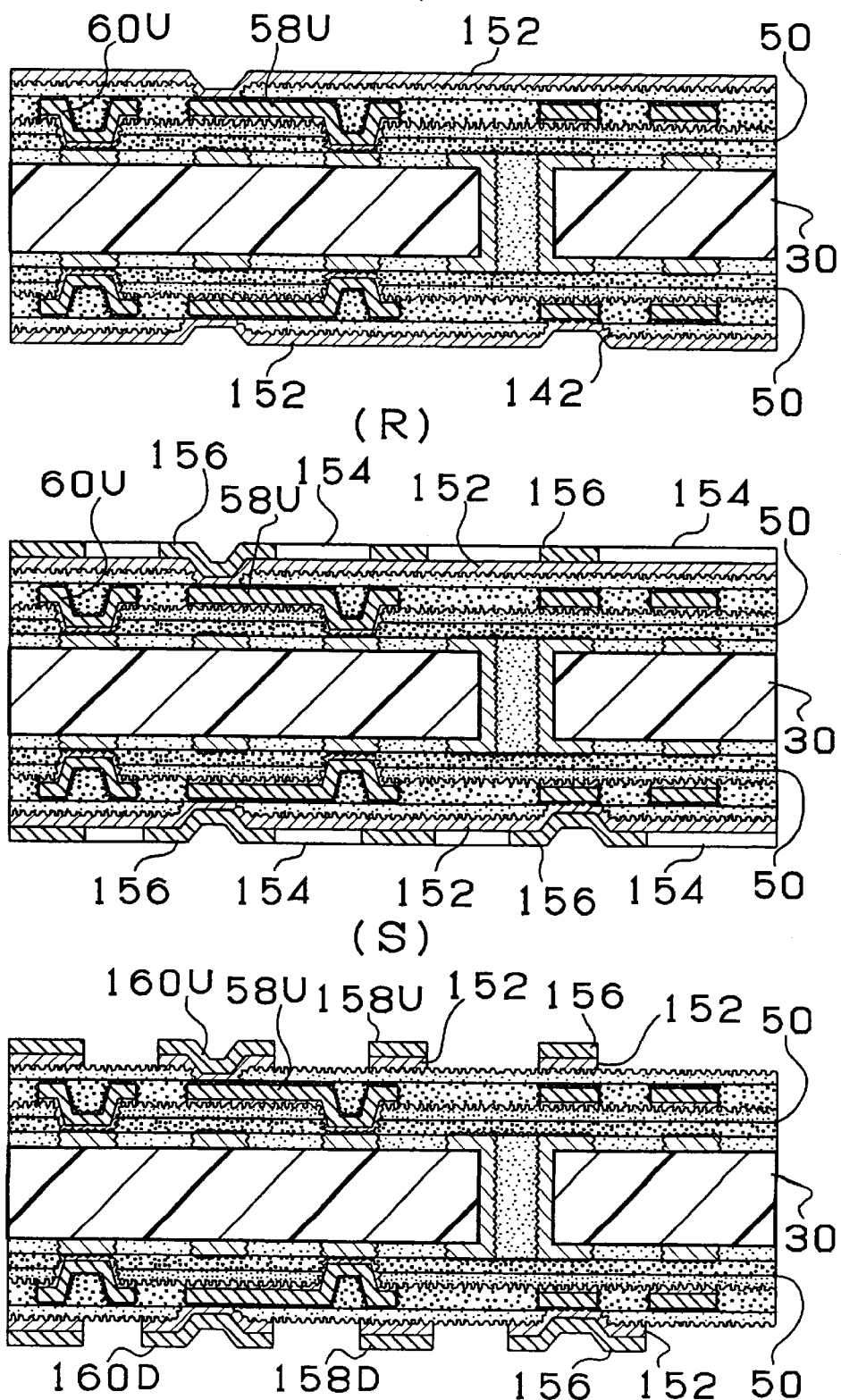

FIG. 2 shows an X1—X1 line cross sectional view of FIG. 1. In other words, FIG. 2 shows a cross sectional view of the package board. The X1—X1 line cross sectional view in FIG. 2 is equal to FIG. 1. As shown in FIG. 2, a dummy pattern 58M is formed between conductor circuits 58U forming signal lines. A dummy pattern mentioned here means a pattern just formed mechanically; it has no functional meaning such as an electrical connection, a capacitor, etc.

Figure 23:
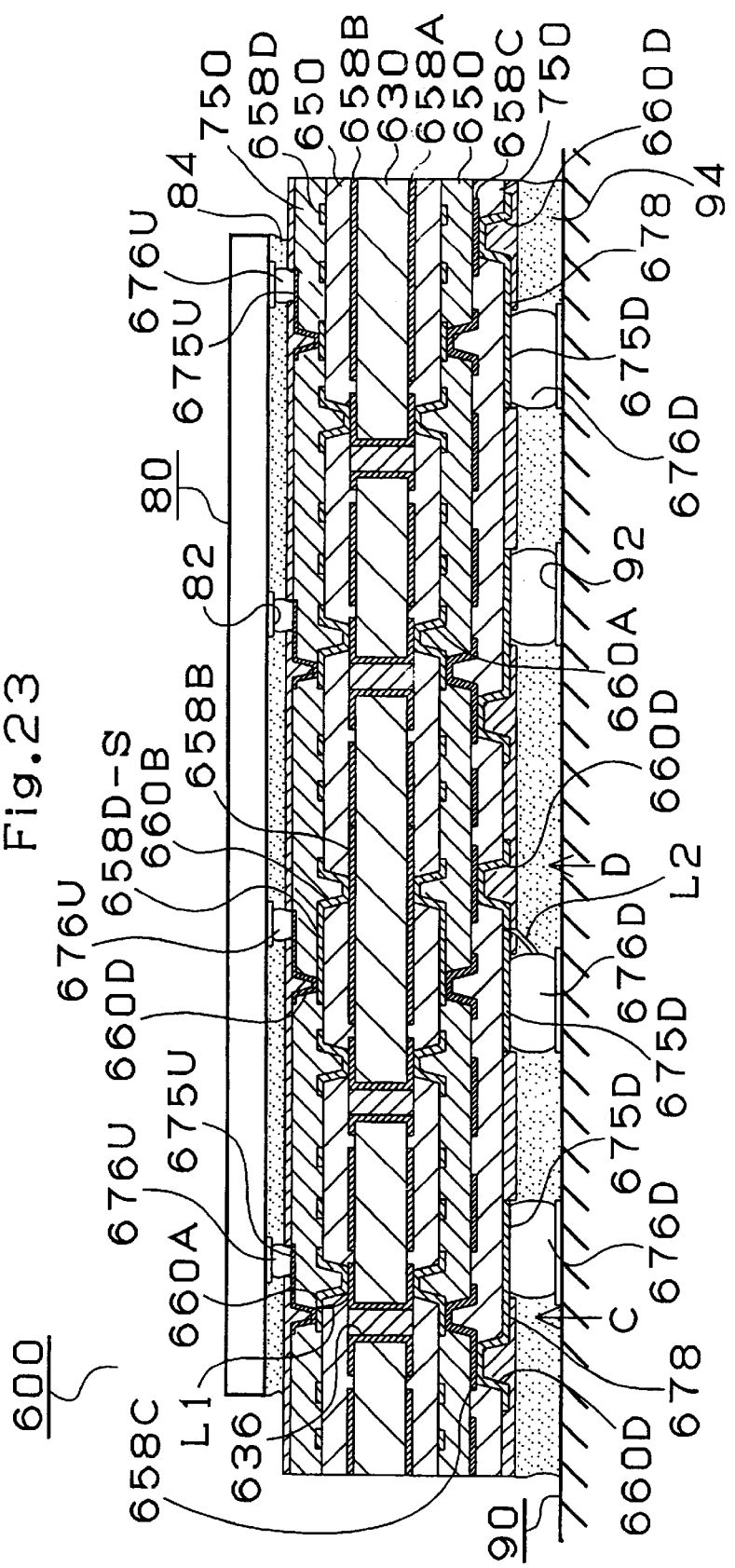
FIG. 23 is a cross sectional view of a prior art package board.

Just like the prior art package board described above with reference to FIG. 23, according to the package board in the first embodiment of the present invention, each soldering pad disposed on the IC chip side surface is small (133 to 170 μm in diameter), so the metallic portion occupied by such soldering pads is also small. On the other hand, since each soldering pad is large (600 μm in diameter) on the mother board side surface (bottom) of the package board, a larger metallic portion is occupied by the soldering pads. This is why a dummy pattern 58M is formed between conductor circuits 58U forming a signal line respectively on the IC chip side surface of the package board thereby to increase the metallic portion and adjust the rate of the metallic portion on the surface of the package board between the IC chip side and the mother board side. It is thus possible to protect the package board from warping in the manufacturing processes to be described later, as well as during a usage of the package board.

Next, how to manufacture the package board shown in FIG. 1 will be described concretely. At first, description will be made for A. Electroless Plating Binding Material, B. Interlaminar Resin Insulating Material, C. Resin Filler, and D. Solder Resist Composition in order.

A. Raw Material Compositions for Manufacturing a Binding Material for Electroless Plating (Upper Layer Binding material)

[Resin Composition (1)]

This resin composition was obtained by mixing and stirring 35 weight parts of a resin solution obtained by dissolving 25% acrylic-modified cresol novolac epoxy resin (Nippon Kayaku, molar weight 2500) into DMDG at a concentration of 80 wt %; 3.15 weight parts of photosensitive monomer (Toagosei, ARONIX M315); 0.5 weight part of an anti-forming agent (SANNOPCO, S-65); and 3.6 weight parts of NMP.

[Resin Composition (2)]

This resin composition was obtained by mixing 12 weight parts of polyether-sulfone (PES) ; 7.2 weight parts of epoxy resin particles (Sanyo Chemical Industries, Polymer Pole) 1.0 μm in average diameter; and 3.09 weight parts of the same epoxy resin particles 0.5 μm in average particle diameter; then adding 30 weight parts of NMP to the mixture and stirring the mixture using a beads mill.

[Hardener Composition (3)]

This hardener composition was obtained by mixing and stirring 2 weight parts of an imidazole hardener (Shikoku Chemicals, 2E4MZOCN); 2 weight parts of a photo-initiator (Ciba Geigy, Irgacure I-907); 0.2 weight part of a photo-sensitizer (Nippon Kayaku, DETX-S); and 1.5 weight parts of NMP.

B. Raw Material Compositions for Manufacturing an Interlaminar Resin Insulating Material (Lower Layer Binding Material)

[Resin Composition (1)]

This resin composition (1) was obtained by mixing and stirring 35 weight parts of a resin solution obtained by dissolving 25% acrylated cresol novolac epoxy resin (Nippon Kayaku, molar weight 2500) into DMDG at a concentration of 80 wt %; 4 weight parts of photosensitive monomer (Toagosei, ARONIX M315); 0.5 weight part of an anti-forming agent (SANNOPCO, S-65); and 3.6 weight parts of NMP.

[Resin Composition (2)]

This resin composition (2) was obtained by mixing 12 weight parts of polyether-sulfone (PES) ; 14.49 weight parts of epoxy resin particles (Sanyo Chemical Industries, Polymer Pole) 0.5 μm in average diameter; then adding 30 weight parts of NMP to the mixture and stirring the mixture using a beads mill.

[Hardener Composition (3)]

This hardener composition (3) was obtained by mixing and stirring 2 weight parts of an imidazole hardener (Shikoku Chemicals, 2E4MZOCN) ; 2 weight parts of a photo-initiator (Ciba Geigy, Irgacure I-907); 0.2 weight part of a photosensitizer (Nippon Kayaku, DETX-S); and 1.5 weight parts of NMP.

C. Raw Material Compositions for Manufacturing a Resin Filler

[Resin Composition (1)]

This composition (1) was obtained by mixing and stirring 100 weight parts of bisphenol F type epoxy monomer (Yuka Shell, molecular weight 310, YL983U); 170 weight parts of $SiO_2$ ball-like particles (Admatec, CRS 1101-CE, the maximum size of particles should be the thickness (15 μm) of the inner layer copper pattern to be described later) 1.6 μm in average diameter, when their surfaces are coated with a silane coupling agent; and 1.5 weight parts of a leveling agent (SANNOPCO, PERENOL S4); then adjusting the viscosity of the mixture to 45,000 to 49,000 cps at 23±1° C.

[Hardener Composition (2)]

6.5 weight parts of imidazole hardener (Shikoku Chemicals, 2E4MZ-CN)

D. Solder Resist Composition

This solder resist composition was obtained by mixing 46.67 g of photosensitive oligomer (molecular weight 4000) obtained by acrylic-modifying 50% of epoxy groups of 60 percentage by weight of cresol novolac dissolved into DMDG of 50% epoxy resin (Nippon Kayaku); 15.0 g of 80 percentage by weight of bisphenol A type epoxy resin (Yuka Shell, Epikote 1001) dissolved into methyl ethyl ketone; 1.6 g of imidazole hardener (Shikoku Chemicals, 2E4MZ-CN); 3 g of multivalent acrylic monomer (Nippon Kayaku, R604) which is photoreceptive monomer; 1.5 g of the same multivalent acrylic monomer (KYOEISHA CHEMICAL, DPE6A); 0.71 g of a scattering anti-foaming agent (SANNOPCO, S-65); then adding 2 g of benzophenone (KANTO CHEMICAL) used as a photoinitiator; and 0. 2 g of Michler's ketone (KANTO CHEMICAL) used as a photosensitizer to the mixture and adjusting the viscosity to 2.0 Pa.s at 25° C.

A rotor No. 4 viscosity meter (Tokyo Keiki, DVL-B type) was used to measure the viscosity at 60 rpm and a rotor No. 3 B type viscosity meter (Tokyo Keiki, DVL-B type) was used to measure the viscosity at 6 rpm.

Next, description will be made for how to manufacture a package board 100 with reference to FIGS. 3 to 9.

E. Manufacturing a Package Board (1) A copper-clad laminate 30A was obtained at first by laminating 18 μm copper foil 32 on both surfaces of a board 30 made of glass epoxy resin or BT (bismaleimide triazine) resin of 1 mm in thickness (process A in FIG. 3). After this, the copper-clad laminate 30A was drilled to make holes, then electroless-plated and etched for patterning thereby to form inner layer copper patterns 34U and 34D on both surfaces of the board 30 and make through-holes 36 in the board 30 (process (B) in FIG. 3)).

(2) After forming the inner layer copper patterns 34U and 34D, as well as through-holes 36, the board 30 was washed in water and dried. Then, the board was treated with oxidation-reduction using NaOH (10 g/l), NaCl02 (40 g/l), and Na3P04 (6 g/l) as oxidation bathing (blackening bathing) agents and using NaOH (10 g/l) and NaBH4 (6 g/l) as reduction agents thereby to form a rough layer 38 on the surface of each of the inner layer copper patterns 34U and 34D, as well as the through-holes 36 (process (C) in FIG. 3)).

(3) The raw material compositions for adjusting the resin filler in C were mixed and stirred to obtain a resin filler.

(4) The resin filler 40 obtained in (3) was coated on both surfaces of the board 30 within 24 hours after the manufacturing using a roll coating device thereby to fill a clearance between the conductor circuits (inner layer copper patterns) 34U, as well as in the through-holes 36. The filler was then dried at 70° C. for 20 minutes. On the other surface, the resin filler 40 was filled in a clearance between the conductor circuits 34D or in the through-holes 36 and dried at 70° C. for 20 minutes (process (D) in FIG. 3)).

(5) After the treatment (4), one surface of the board 30 was sanded using a belt sanding machine and a #600 belt sand paper (Sankyo Rikagaku) to remove the resin filler 40 completely from the surfaces of both inner layer copper patterns 34U and 34D, as well as from the surface of the land 36a of each through-hole 36. After this, the surface of the board 30 was buffed to remove scratches made by the belt sanding. Such a series of sanding was also carried out for the other surface of the board in the same way (process (E) in FIG. 4)).

After this, the resin filler 40 was hardened by baking at 100° C. for one hour, at 120° C. for three hours, at 150° C. for one hour, and at 180° C. for seven hours respectively.

In this way, the surface layer of the resin filler 40 was removed from the through-holes 36, etc., and the rough layer of the top surface of the inner layer conductor circuits 34U and 34D was removed thereby to smooth both surfaces of the board 30. It was thus possible to obtain a wire board on which the resin filler 40 was in close contact with side surfaces of each of the inner layer conductor circuits 34 with a rough layer 38 therebetween, as well as the resin filler 40 was in close contact with the inner wall of each through-hole 36 with a rough layer 38 therebetween. In other words, this process was effective to align the surfaces of the resin filler 40 and the inner layer copper pattern 34 on the same level.

(6) After forming the conductor circuits 34U and 34D, the board 30 was alkaline-degreased for soft-etching, then the board 30 was treated with a catalyst solvent consisting of palladium chloride and organic acid thereby to add a Pd catalyst. The catalyst was then activated, and the board 30 was dipped in an electroless plating solvent consisting of $3.2 \times 10^{-2}$ mol/l of copper sulfate, $3.9 \times 10^{-3}$ mol/l of nickel sulfate, $5.4 \times 10^{-2}$ mol/l of a complexing agent, $3.3 \times 10^{-1}$ mol/l of sodium hypophosphite, $5.0 \times 10^{-1}$ mol/l of boracic acid, 0.1 g/l of a surface active agent (Nissin Chemical Industry, Surfynol 465), and PH=9. One minute later, the board 30 was vibrated in both vertical and horizontal directions once every 4 seconds thereby to form a needle-like alloy, coating layer consisting of Cu—Ni—P and a rough layer 42 on the surfaces of each of the conductor circuits 34, as well as on the surface of the land 36a of each of the through-holes 36 (process (F)) in FIG. 4).

Furthermore, an Sn layer of 0.3 μm in thickness (not illustrated) was formed on the surface of the rough layer by a Cu-Sn substitution reaction on the conditions of 0.1 mol/l of boracic stannous fluoride, 1.0 mol/l of thiocarbamide, 35° C., and PH=1.2.

(7) The raw material compositions used to adjust the interlaminar resin insulator obtained in B were stirred and mixed thereby to obtain an interlaminar resin insulator (for lower layers). The viscosity of the layer was then adjusted to 1.5 Pa.s.

After this, the raw material compositions used to manufacture a binding material of electroless plating obtained in A were stirred and mixed thereby to obtain a binding solution (for the upper layer) for electroless plating. The viscosity of the solution was then adjusted to 7 Pa.s.

(8) Both surfaces of the board obtained in (6) were coated with an interlaminar resin insulation material (for lower layers) 44 of 1.5 Pa.s in viscosity using a roll coating device within 24 hours after the solution was manufactured. Then, the board was left horizontally for 20 minutes, then dried (prebaking) at 60° C. for 30 minutes. After this, the board was coated with a sensitive binding solution 46 (for upper layers) of 7 Pa.s in viscosity obtained in (7) within 24 hours after the solution was manufactured, then the board was left horizontally for 20 minutes. Then, the board was dried (prebaking) at 60° C. for 30 minutes thereby to form a binding material layer 50α of 35 μm in thickness (process (G) in FIG. 4)).

(9) A photo-masking film (not illustrated) provided with 85 μmφ printed black circles was stuck fast to each surface of the board 30 on which a binding layer was formed respectively in (8), then exposed at 500 mJ/cm$^2$ using a super high voltage mercury lamp. A DMTG solution was then sprayed on the black circle for developing. Furthermore, the board 30 was exposed at 3000 mJ/cm$^2$ using a super high voltage mercury lamp, then heated (post-baking) at 100° C. for one hour, at 120° C. for one hour, and at 150° C. for 3 hours thereby to form an interlaminar resin insulating layer (two-layer structure) of 35 μm in thickness. The layer was thus provided with 85 μmφ openings (used to form via-holes), which were excellent in size accuracy, functioning equally to a photo-masking film (process (H) in FIG. 5)). The tinned layer (not illustrated) was partially exposed in each of the openings 48 to be used as via-holes.

(10) The board 30 provided with the openings 48 was then dipped in chromic acid for 19 minutes thereby to melt and remove epoxy resin from the surface of the interlaminar resin insulation layer 50 and make the surface rough (process (I) in FIG. 5)). After this, the board 30 was dipped in a neutralized solution (SHIPLEY), then washed by water.

A palladium catalyst (Atotech) was thus applied to the roughened surface (roughened depth 6 μm) of the board 30 to stick catalytic nuclei on the surface of the interlaminar resin insulating layer 50, as well as the inner wall surface of each of the via-hole openings 48.

(11) The board was then dipped in an electroless copper plating water solution consisting of the following compositions thereby to form an electroless copper plating film 52 of 0.6 μm in thickness on the whole rough surface of the board 30 (process (J) in FIG. 5)).

[Electroless Plating Water Solution]

EDTA . . . 150 g/l

Copper sulfate . . . 20 g/l

HCHO . . . 30 ml/l

NaOH . . . 40 g/l

α,α'-bipyridyl . . . 80 mg/l

PEG . . . 0.1 g/l

[Electroless Plating Conditions]

30 min. at a solution temperature of 70° C.

(12) A market-sold photosensitive dry film was stuck on the electroless copper plating film 52 formed in (11), then a mask was put on the film for exposing at 100 mJ/cm$^2$ and for developing using 0.8% sodium thereby to form a plating resist 54 of 15 μm in thickness (process (K) in FIG. 6)).

(13) After this, the no-resist-formed portion was plated with electrolytic copper thereby to form an electrolytic copper plated film 56 of 15 μm in thickness (process (L) in FIG. 6)).

[Electrolytic Plating Water Solution]

Sulfuric acid . . . 180 g/l

Copper sulfate . . . 80 g/l

Additive (Atotech Japan, Cupracid GL) . . . 1 ml/l

[Electrolytic Plating Conditions]

Current density . . . 1 A/dm$^2$

Time . . . 30 min.

Temperature . . . Room temp.

(14) The plating resist 54 was separated and removed with 5%KOH, then the electroless plated film 52 under the plating resist was melted and removed with etching treatment using a mixed solution of sulfuric acid and hydrogen peroxide thereby to form conductor circuits 58U and 58D of 18 μm in thickness respectively, as well as via-holes 60U and 60D consisting of an electroless copper plated film 52 and an electrolytic copper plated film 56 respectively (process (M) in FIG. 6)).

(15) The same treatments as those in (6) were carried out to form a rough surface 62 consisting of Cu—Ni—P on the surfaces of the conductor circuits 58U and 58D, as well as the surfaces of the via-holes 60U and 60D. Furthermore, Sn displacement was carried out for the rough surface 62 (process (N) in FIG. 7)).

(16) The processes (7) to (15) were repeated to form conductor circuits in a further upper layer. In other words, both surfaces of the board 30 were coated with an interlaminar resin insulating material (for lower layers) using a roll coating device to form an insulating layer 144. In addition, this insulating layer 144 was coated with a photosensitive binding material (for upper layers) using a roll coating device to form a binding material layer 146 (process (O) in FIG. 7)). After this, a photo-masking film was stuck fast to both surfaces of the board 30 on which the layers 144 and 146 were formed, then exposed and developed to form an interlaminar resin insulating layer 150 provided with openings (via-holes 148). The surface of the interlaminar resin insulating layer 150 was then roughened (process (P) in FIG. 7)). After this, an electroless copper plated film 152 was formed on the roughened surface of the board 30 (process (Q) in FIG. 8)). It was followed by forming of a plating resist 154 on the electroless copper plated film 152, then by forming of an electrolytic copper plated film 156 on the no-resist-coated portion of the film 152 (process (R) in FIG. 8)). The plating resist 154 was then separated and removed with KOH, and the electroless plated film 152 under the plating resist 54 was melted and removed thereby to form conductor circuits 158U and 158D, as well as via-holes 160U and 160D (process (S) in FIG. 8)). Then, a roughened layer 162 was formed on the roughened surface 162 formed on the surfaces of the conductor circuits 158 and the via-holes 160 (process (T). in FIG. 9)). No Sn displacement was carried out for the roughened surface 162 at this time.

(17) Both surfaces of the board 30 obtained in (16) were coated with a solder resist composition 70α described in D at a thickness of 45 μm. The board 30 was then dried at 70° C. for 20 minutes, then at 70° C. for 30 minutes. After this, a photo-masking film (not illustrated) of 4 mm in thickness on which circles (masking pattern) were drawn was stuck fast to both surfaces of the board 30 respectively, then exposed with an ultraviolet beam of 1000 mJ/cm$^2$ and developed with DMTG. In addition, the board 30 was baked at 80° C. for 1 hour, at 100° C. for 1 hour, at 120° C. for 1 hour, and at 150° C. for 3 hours thereby to form a solder resist layer (20 μm thick) provided with an opening (200 μm diameter) 71 at each soldering pad (including the via-hole and its land) (process (U) in FIG. 9)).

(18) After this, the board 30 was dipped in an electroless nickel plating solution of pH=4.5 for 20 minutes to form a nickel plated layer 72 of 5 μm in thickness. The electroless nickel plating solution consisted of 2.31×10$^{-1}$ mol/l of nickel chloride, 2.8×10$^{-1}$ mol/l of sodium hypophosphite, and 1.85×10$^{-1}$ mol/l of sodium citrate. The board 30 was then dipped in an electroless gold plating solution for 7 minutes 20 seconds at 80° C. to form a gold plated layer 74 of 0.03 μm in thickness on the nickel plated layer, so that soldering pads 75U and 75D were formed on the via-holes 160U and 160D, as well as on the conductor circuits 158U and 158D (see. FIG. 1). The electroless gold plating solution consisted of 4.1×10$^{-2}$ mol/l of gold potassium cyanide, 1.87×10$^{-1}$ mol/l of ammonium chloride, 1.16×10$^{-1}$ mol/l of sodium citrate, and 1.7×10$^{-1}$ mol/l of sodium hypophosphite.

(19) Soldering paste was printed in the openings 71 of the solder resist layer 70 and reflowed at 200° C. thereby to form soldering bumps (soldering bodies) 76U and 76D. This completed manufacturing of the package board 10 (see FIG. 1).

Although the package board was formed with the semi-additive process in the above embodiment, the configuration of the present invention may also apply to a package board to be formed with the full-additive process, of course.

Although a dummy pattern 58M is formed between conductor circuits 58U formed between the interlaminar resin insulating layer 50 and the interlaminar resin insulating layer 150 in the first embodiment, such a dummy pattern 58M may also be formed between the inner layer copper patterns 34D formed on the core board 30 or between outermost layer conductor circuits 158U.

As described above, according to the package board in the first embodiment, a dummy pattern is formed between conductor circuits that form signal lines on the IC chip side surface of the package board thereby to increase the metallic portion on the IC chip side surface of the package board and adjust the rate of the metallic portion between the IC chip side and the mother board side on the package board. It is thus possible to protect the package board from warping in the manufacturing processes, as well as during operation.

SECOND EMBODIMENT

Figure 10:
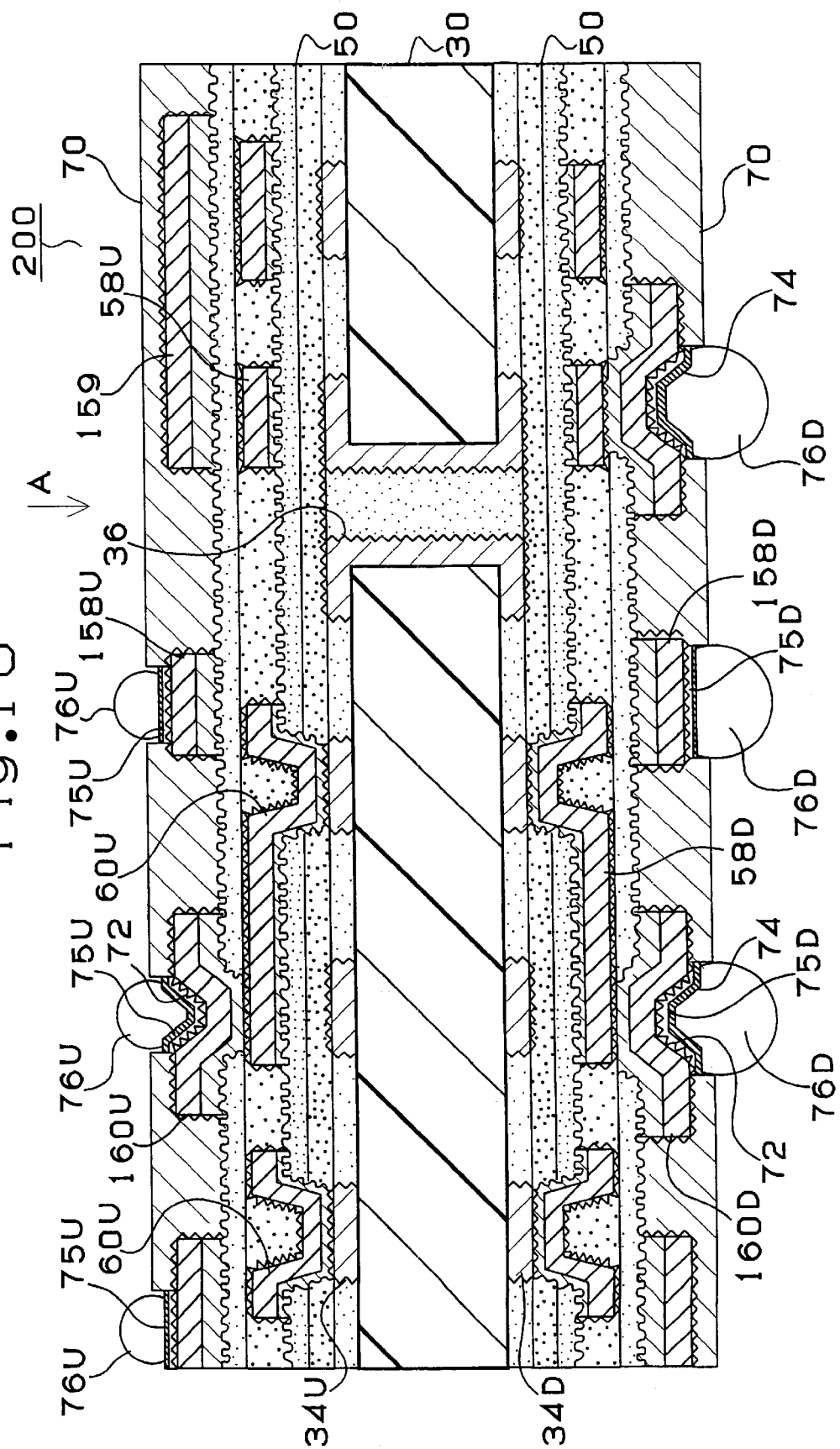
FIG. 10 is a cross sectional view of the package board in a second embodiment of the present invention.
Figure 12:
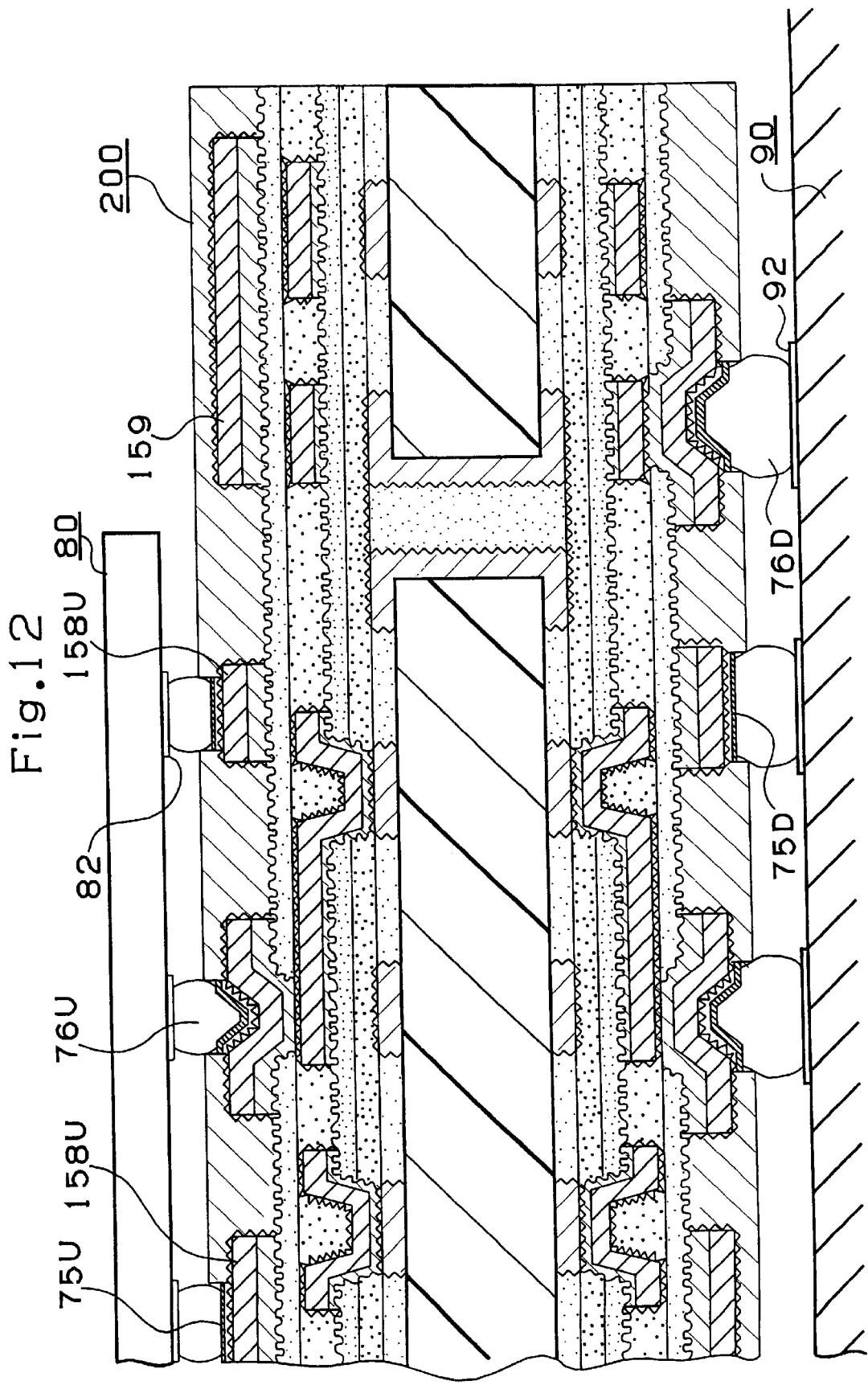
FIG. 12 is a cross sectional view of the package board shown in FIG. 10 when the package board with an IC chip mounted thereon is attached to a mother board.

Hereunder, a configuration of the package board in the second embodiment of the present invention will be described with reference to FIGS. 10 to 12. FIG. 10 is a cross sectional view of the package board in the second embodiment. FIG. 11A is a top view of the package board and FIG. 11B is a bottom view of an IC chip mounted on the package board. FIG. 12 illustrates how the IC chip 80 is mounted on the top of the package board shown in FIG. 10 as a cross sectional view of the package board mounted on a mother board 90. The package board is provided with soldering bumps 76U on its top surface and soldering bumps 76D on the bottom surface as shown in FIG. 12. Those bumps are connected to the bumps 82 of the IC chip 80 and the bumps 92 of the mother board 90 respectively. Those bumps are used to pass signals between the IC chip 80 and the mother board 90, as well as relay a supply power from the mother board to other parts.

As shown in FIG. 10, on both top and bottom surfaces of the core board 30 of the package board are formed inner layer copper patterns 34U and 34D, which are used as ground layers. In the upper layer of the inner layer copper pattern 34U is formed a conductor circuit 58U for forming a signal line with an interlaminar resin insulating layer 50 therebetween and a via-hole 60U through the interlaminar resin insulating layer 50. In the upper layer of the conductor circuit 58U are formed the outermost layer conductor circuits 158U with an interlaminar resin insulating layer 150 therebetween, as well as via-holes 160U through both a dummy pattern 159 and an interlaminar resin insulating layer 150. The dummy pattern 159 is formed at the outer periphery of each of the conductor circuits 158U as shown in FIG. 11, that is, along the circumference of the package board. On each of the conductor circuits 158U and via-holes 160U is formed a soldering pad 75U for supporting a soldering bump 76U. The soldering pads 75U on the IC chip side surface are formed so as to be 120 to 170 μm in diameter.

On the other hand, in the upper layer of the ground layer (inner layer copper pattern) on the bottom side of the core board 30 are formed conductor circuits 58D for forming signal lines with the interlaminar resin insulating layer 50 therebetween. In the upper layer of the conductor circuits 58D are formed the outermost layer conductor circuits 158D with the interlaminar resin insulating layer 150 therebetween, as well as via-holes 160D through the interlaminar resin insulating layer 150. On each of the conductor circuits 158D and the via-holes 160D is formed a soldering pad 75D for supporting a soldering bump 76D. The soldering pads 75D on the mother board side surface are formed so as to be 600 to 700 μm in diameter.

FIG. 11A is a top view of the package board 200, that is, an A-line view of FIG. 10. FIG. 10 is equal to the X2—X2 line vertical cross sectional view of FIG. 11A. As shown in FIG. 11A and FIG. 10, at the outer periphery of each of the conductor circuits 158U for forming signal lines on the lower layer of the solder resist 70 is formed a 10 mm-wide dummy pattern 159. The dummy pattern mentioned here means a pattern formed just mechanically; it has no functional meaning such as an electric connection, capacitor, etc.

Like the package board manufactured with the prior. art described above with reference to FIG. 23, according to the package board in the second embodiment, the IC chip 80 side (top) surface of the package board is provided with smaller soldering pads 76U (120 to 170 μm in diameter), so the metallic portion occupied by those soldering pads on the surface of the package board is also small. On the other hand, the mother board 90 side (bottom) surface of the package board is provided with larger soldering pads 75D (600 to 700 μm in diameter), so the metallic portion occupied by those soldering pads on the surface of the package board is also large. This is why the package board in this embodiment forms a dummy pattern 159 at the outer periphery of each of the outermost layer conductor circuits 158U on the IC chip side surface of the package board thereby to increase the metallic portion on the surface and adjust the rate of the metallic portion between the IC chip side and the mother board side on the surface of the package board. The dummy patterns 159 are also effective to improve the mechanical strength of the circumference of the package board, protecting the package board from warping in the manufacturing processes, as well as during operation.

FIG. 11A shows a top view (A-line view of FIG. 10) of a completed package board and FIG. 11B shows a bottom view of an IC chip. The package board 100, while the IC chip 80 is put thereon, is passed through a reflowing oven to fix the IC chip on the package board through the soldering bumps 76U as shown in FIG. 12. After this, the package board 100 with the IC chip mounted thereon is mounted on a mother board 90, then passed in a reflowing oven thereby to fix the package board on the mother board 90.

How to manufacture the package board in this second embodiment to the fifth embodiment to be described later will be omitted here, since it is the same as the method described in the first embodiment with reference to FIGS. 3 to 9.

In the second embodiment described above, a dummy pattern 159 is formed around each of the outermost layer conductor circuits 158U formed on the interlaminar resin insulating layer 150. However, the dummy pattern 159 may also be formed around each conductor circuit 58U formed between inner layer copper patterns 34D or around each of the conductor circuits 58U formed between the interlaminar resin insulating layers 50 and 150.

As described above, according to the package board in the second embodiment, a dummy pattern is formed around each conductor circuit on the IC chip side surface of the package board thereby to increase the metallic portion on the surface and adjust the rate of the metallic portion between the IC chip side and the mother board side on the surface of the package board, protecting the package board from warping in the manufacturing processes, as well as during operation.

THIRD EMBODIMENT

Figure 13:
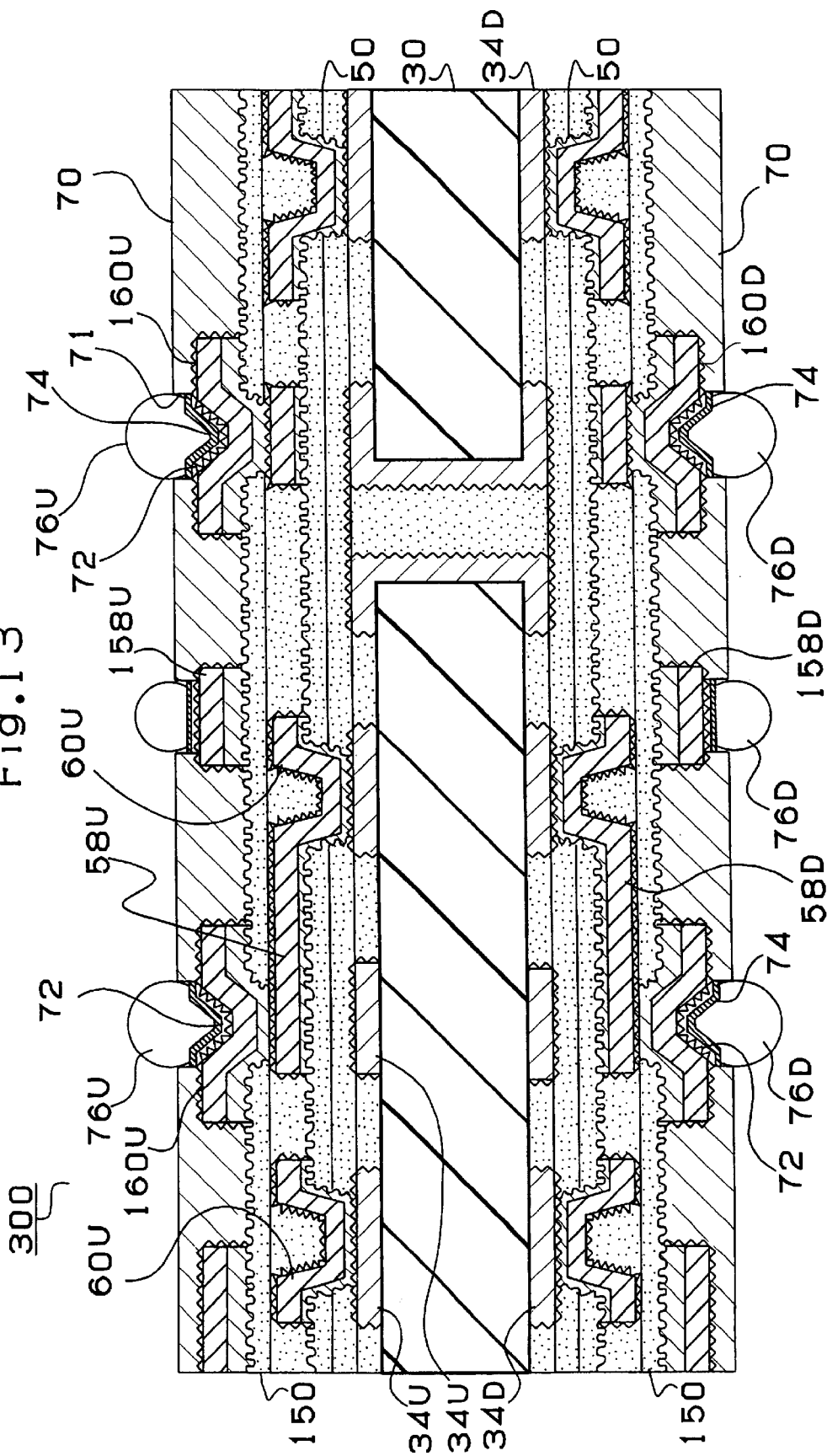
FIG. 13 is a cross sectional view of a multi-layer printed wiring board in a third embodiment of the present invention.

Hereunder, a configuration of the package board in the third embodiment of the present invention will be described with reference to FIG. 13.

The core board 30 of the package board 300 is provided with inner layer copper patterns 34U used as signal lines and formed on its top surface, as well as inner layer copper patterns 34D used as signal lines and formed on its bottom surface respectively. In the upper layer of each inner layer copper pattern 34U is formed a conductor circuit 58U that forms a power supply layer with the interlaminar resin insulating layer 50 therebetween. In the upper layer of each conductor circuit 58U is formed an outermost layer conductor circuit 158 with the interlaminar resin insulating layer 150 therebetween, as well as a via-hole 160U through the interlaminar resin insulating layer 150. In the via-hole 160U is formed a soldering bump 76U. In other words, the package board is composed in the third embodiment so that a soldering bump 76U is formed on a via-hole 160U connected to a conductor circuit 58U that forms a power supply layer. The power supply layer can thus be connected directly to an external bump (not illustrated).

On the other hand, a conductor circuit 58D used as a ground layer is formed in the upper layer of a signal line (inner layer copper pattern) 34D with the interlaminar resin insulating layer 50 therebetween on the bottom side of the core board 30. In the upper layer of each conductor circuit 58D is formed an outermost layer conductor circuit 158D with the interlaminar resin insulating layer therebetween 150, as well as a via-hole 160D through the interlaminar resin insulating layer 150. A soldering bump 76D is formed on the via-hole 160D. In other words, the package board is composed in this embodiment so that a soldering bump 76D is formed on a via-hole 160D connected to a conductor circuit 58D composing a ground layer. The ground layer can thus be connected directly to an external bump (not illustrated).

According to the package board configuration in this embodiment, the conductor circuits 58U and 58D disposed under the interlaminar resin insulating layer 150 supporting the conductor circuits 158U and 158D in the outermost layer are used as a power supply layer and a ground layer. And, via-holes 160U and 160D are connected directly to the conductor circuits 58U and 58D, and soldering bumps 76U and 76D are formed in the via-holes respectively. Consequently, it is not necessary to connect any power supply layer or ground layer directly to soldering bumps. The package board is thus protected from noise mixed in wires. It is thus possible to reduce the influence of noise expected while passing signals between the IC and the mother board, as well as while relaying a supply power from the mother board to other parts. In addition, since there are less wires, the multi-layer printed wiring board (package board) can be packed more densely. According to the multi-layer printed wiring board in this embodiment, a conductor circuit 58U is used as a power supply layer and a conductor circuit 58D is used as a ground layer. The conductor circuit 58U or 58D, however, may be formed in the same layer together with other conductor circuits functioning as a power supply layer and a ground layer respectively.

Next, a description will be made for a multi-layer printed wiring board composed as a variation of the third embodiment with reference to FIG. 14.

Figure 14:
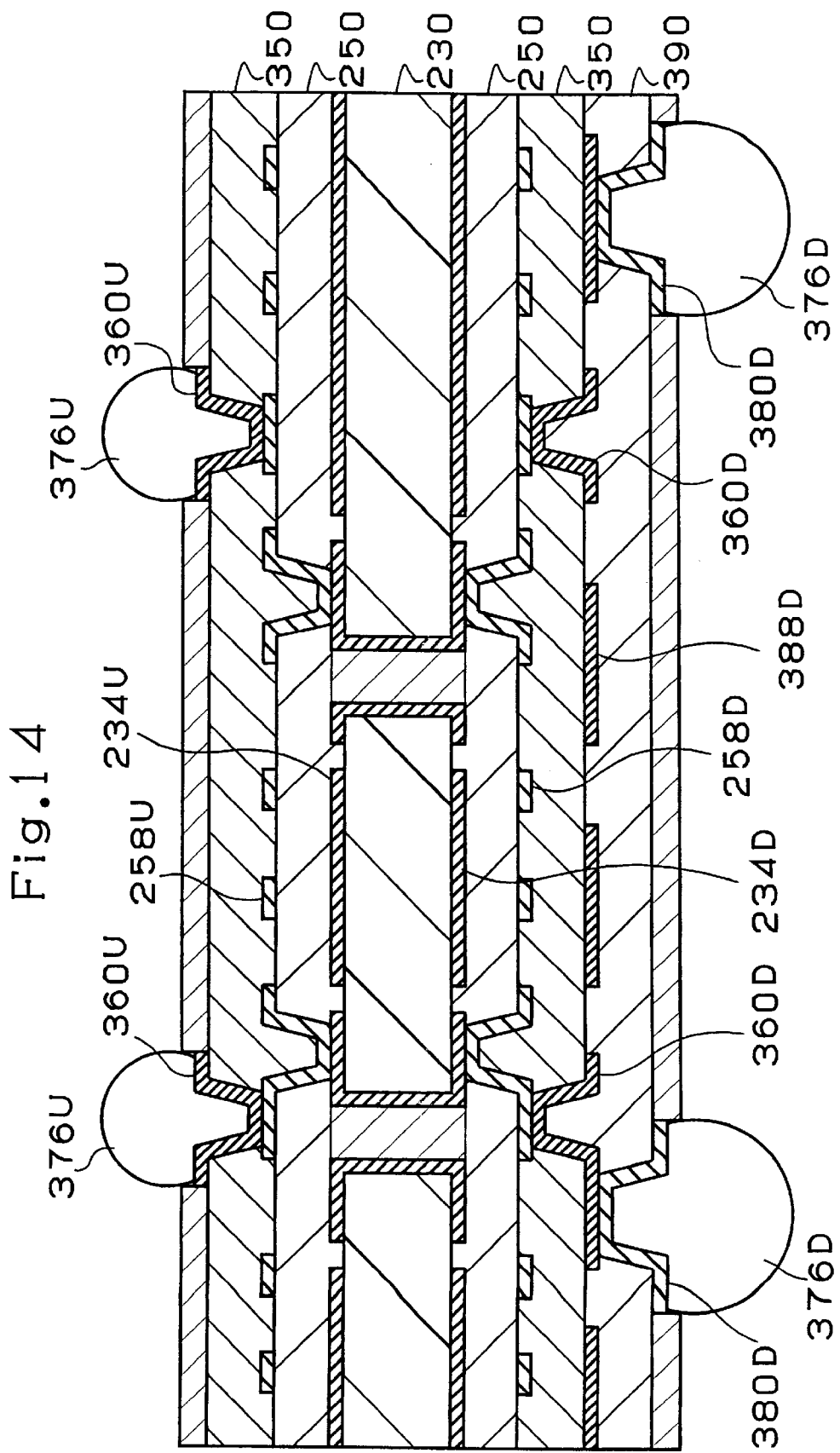
FIG. 14 is a cross sectional view of a configuration of a variation of the multi-layer printed wiring board in the third embodiment of the present invention.

FIG. 14 is a cross sectional view of a configuration of the multi-layer printed wiring board in the second embodiment of the present invention. On both top and bottom surfaces of the core board 230 are formed inner layer copper patterns 234U and 234D used as ground layers. In other words, capacitors are formed with the ground layers (inner layer copper patterns) 234U and 234D that face each other with the core board therebetween.

Furthermore, on the upper layer of the inner layer copper pattern 234U are formed a conductor circuits 258U that form signal lines with the interlaminar resin insulating layer 250 therebetween. In the upper layer of the conductor circuits 258U are formed via-holes 360U through the interlaminar resin insulating layer 350. And, a soldering bump 376U is formed on each of those via-holes 360U.

On the other hand, in the upper layer of the ground layer (inner layer copper pattern) 234D formed on the bottom surface of the board 230 is formed a conductor circuit 258D that forms a signal line with the interlaminar resin insulating layer 250 therebetween. In the upper layer of the conductor circuit 258D is formed a conductor circuit 388D used as a power supply layer with the interlaminar resin insulating layer 350 therebetween. In the upper layer of the conductor circuit 388D is formed a via-hole 380D through the interlaminar resin insulating layer 390. And, a soldering bump 376D is formed in the via-hole 380D. In other words, a soldering bump 376D is formed in a via-hole 380D connected to a conductor circuit 388D used as a power supply layer. The power supply layer can thus be connected directly to an external bump (not illustrated).

In the third embodiment, a via-hole 380D is connected directly to the conductor circuit 388D used as a power supply layer and a soldering bump 376D is formed in a via-hole. Consequently, it is not necessary to provide a wire for connecting the power supply layer to soldering bumps. It is thus possible to make the package board free of noise mixed in wires.

As described above, according to the package board in the third embodiment, an inner layer conductor circuit formed in the lower layer of the insulating layer supporting the conductor circuits formed in the outermost layer is used as a power supply layer and/or a ground layer, and a via-hole is connected directly to a second conductor circuit and a soldering bump is formed in each of those via-holes. The package board can therefore eliminate a wire for connecting the power supply layer or the ground layer to soldering bumps. Consequently, it is possible to make the package board free of noise mixed in wires. Furthermore, the wiring-eliminated space can be used to pack the multi-layer printed wiring board in a higher density.

Furthermore, according to the package board in the third embodiment, a second conductor circuit formed under the second interlaminar resin insulating layer supporting the outermost layer conductor circuits is used as a power supply layer or a ground layer, and a via-hole is connected directly to the second conductor circuit and a soldering bump is formed on the via-hole. The package board can thus eliminate a wire for connecting the power supply layer or the ground layer to soldering bumps. Consequently, it is possible to make the package board free of noise mixed in wires. Furthermore, the wiring-eliminated space can be used to pack the multi-layer printed wiring board more densely.

FOURTH EMBODIMENT

Hereunder, a configuration of the package board in the fourth embodiment of the present invention will be described with reference to FIG. 15. On both top and bottom surfaces of the core board 30 of the package board 400 are formed inner layer copper patterns 34U and 34D used as a ground layer respectively. In the upper layer of the inner layer copper pattern 34U are formed a conductor circuit 58U that forms a signal line with an interlaminar resin insulating layer 50 therebetween, as well as a via-hole 60U through the interlaminar resin insulating layer 50. In the upper layer of the conductor circuit 58U is formed an outermost layer conductor circuit 158U with an interlaminar resin insulating layer 150 therebetween, as well as a via-hole 160U through the interlaminar resin insulating layer 150. And, a soldering pad 75U for supporting a soldering bump 76U is formed on the conductor circuit 158U and the via-hole 160U respectively. Each of the soldering pads 75U on the IC chip side surface of the package board is formed so as to be 133 to 170 $\mu$m in diameter.

On the other hand, in the upper layer of the inner layer copper pattern 34D formed on the bottom surface of the core board 30 is formed a conductor circuit 58D that forms a signal line with the interlaminar resin insulating layer 50 therebetween. In the upper layer of the conductor circuit 58D is formed an outermost layer conductor circuit 158D with the interlaminar resin insulating layer 150 therebetween, as well as a via-hole 160D through the interlaminar resin insulating layer 150. And, a soldering pad 75D for supporting a soldering bump 76D is formed on the conductor circuit 158D and the via-hole 160D respectively. Each of those soldering pads 75D on this mother board side surface of the package board is formed so as to be 600 $\mu$m in diameter. In addition, a ground (electrode) layer is formed on each of the inner layer copper patterns 34U and 34D that face each other with the core board 30 therebetween, so that a capacitor is formed with those inner layer copper patterns 34U and 34D.

FIG. 16A is a top view of an inner layer copper pattern 34U formed on the top surface of the core board 30. On this inner layer copper pattern 34U are formed a ground layer 34G and land-pads 41 used to connect the upper layer to the lower layer respectively. FIG. 16B shows an expanded land-pad 41 formed in the B area in FIG. 16A. The X3—X3 line cross sectional view in FIG. 16B is equal to the X3—X3 line cross sectional view in FIG. 15.

Figure 15:
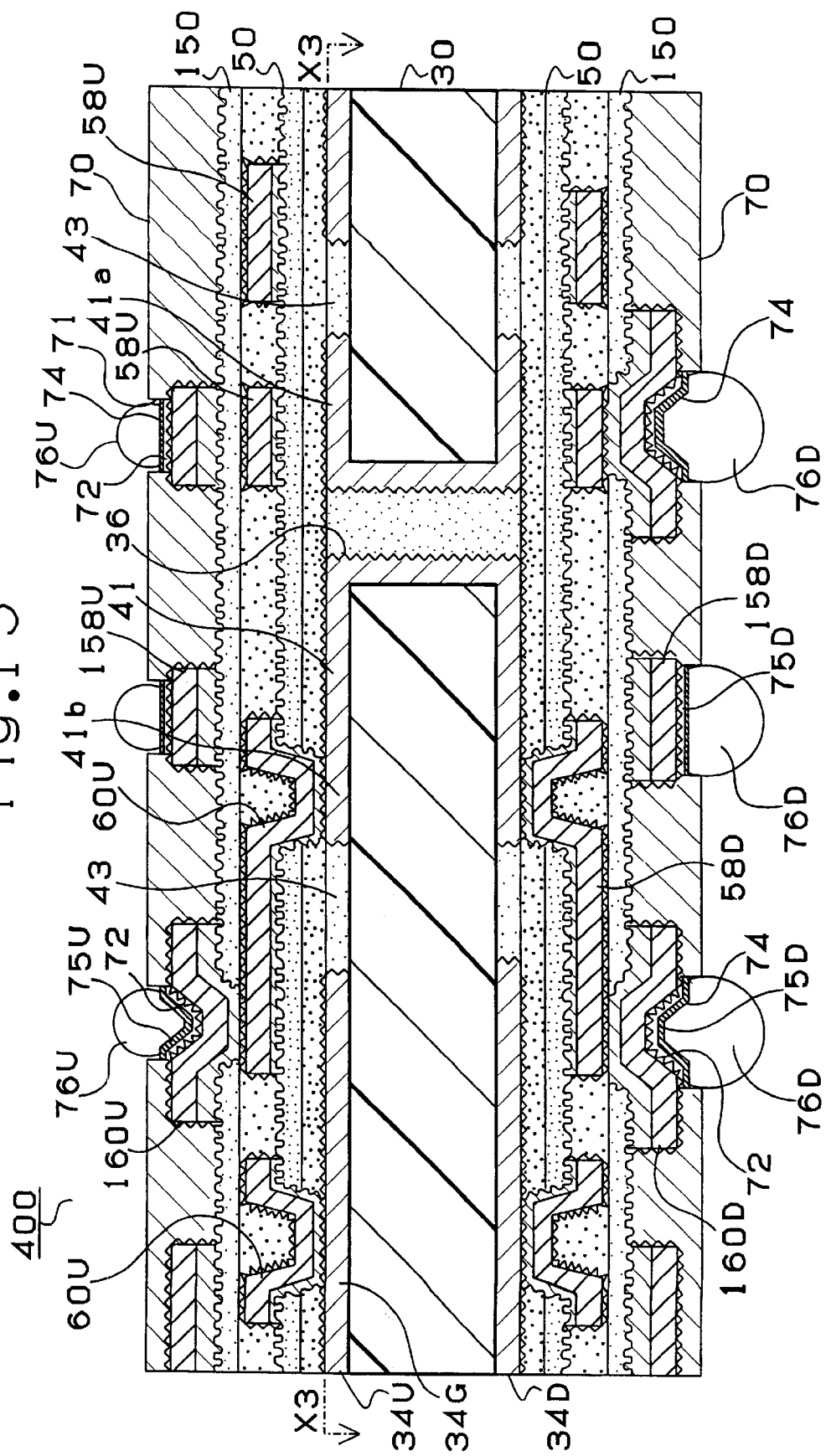
FIG. 15 is a cross sectional view of the package board in the fourth embodiment of the present invention.

As shown in FIG. 16B, each land-pad 41 is a combination of the land 41a of a through-hole 36 shown in FIG. 15 and a pad 41b connected to a via-hole 60U that goes through the upper interlaminar resin insulating layer 50. Around the lad pad 41 is disposed an insulating buffer 43 of about 200 $\mu$m in width.

According to the package board in this embodiment, a land 41a is united with a pad 41b as shown in FIG. 16B, so that the land 41a is connected directly to the pad 41b without using a wire. It is thus possible to shorten the transmission path between the lower layer (the conductor circuit 58D) and the upper conductor wiring 58U in the upper layer (the interlaminar resin insulating layer 50) thereby to speed up the signal transmission, as well as reduce the connection resistance. In addition, since the land 41a is connected directly to the pad 41b without using a wire, no stress is concentrated between a wire and a land or between a wire and a pad. The package board is thus protected completely from breaking of a wire caused by a crack generated by concentrated stress at such a place, although the package board manufactured with the prior art technology described above with reference to FIG. 24A has confronted with such a problem. And, although a description was made for only the inner layer copper pattern 34U formed on the top surface of the core board 30, the inner layer copper pattern 34D on the bottom surface of the core board 30 is also composed in the same way.

Figure 17:
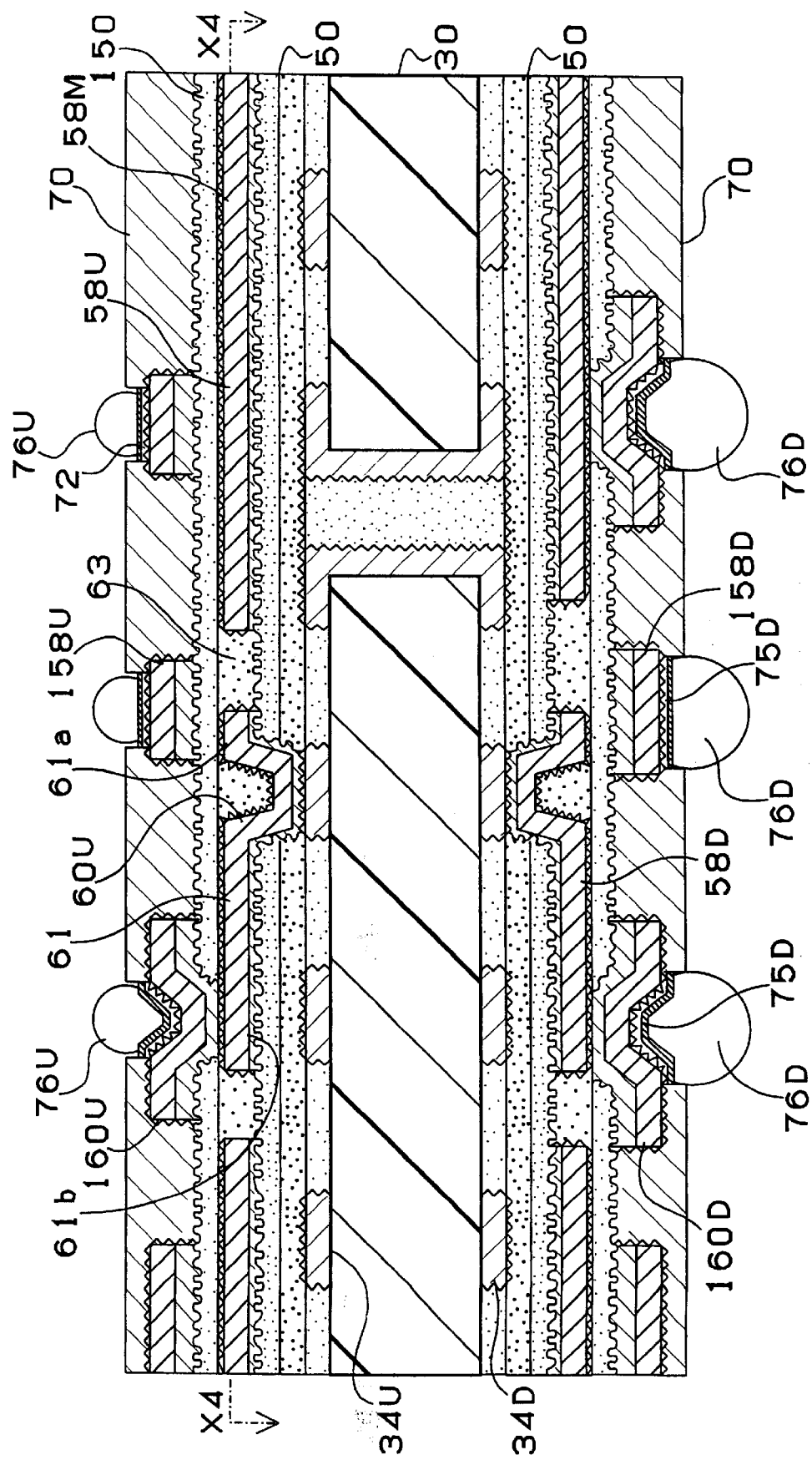
FIG. 17 is a cross sectional view of a package board composed as a variation of the package board in the fourth embodiment of the present invention.

Next, a description will be made for a package board composed as a variation of the fourth embodiment of the present invention with reference to FIGS. 17 and 18. According to the fourth embodiment described above with reference to FIG. 15, the ground layer (electrode layer) 34G and the land-pad 41 are formed on the inner layer copper patterns 34U and 34D formed on both top and bottom surfaces of the core board 30. On the contrary, in the second embodiment, the power supply layer (electrode layer) 58G and the land-pad 61 are formed on the conductor circuits 58U and 58D formed in the upper layer of the interlaminar resin insulating layer 50 as shown in FIG. 16A FIG. 17 is a cross sectional view of the package board composed as a variation of the fourth embodiment. FIG. 18A is a top view of the conductor circuit 58U formed on the top surface of the interlaminar resin insulating layer 50. On this conductor circuit 58U are formed a power supply layer 58G, as well as land-pads 61 used to connect the upper layer to the lower layer respectively. FIG. 18B shows an expanded land-pad 61 in the B area shown in FIG. 18A. The X4—X4 line cross sectional view shown in FIG. 18B is equal to the X4—X4 line cross sectional view shown in FIG. 17.

As shown in FIG. 17, each of those land-pads 61 is a combination of the land 61a of a via-hole 60U connected to an inner layer copper pattern 34U and a pad 61b connected to a via-hole 160U going through the upper interlaminar resin insulating layer 150. Around each of those land pad 61 is disposed an insulating buffer 63 of about 200 μm in width as shown in FIG. 18B.

Also in the case of this package board composed as a variation of the fourth embodiment, a land 61a is united with a pad 61b, so that the land 61a is connected directly to the pad 61b without using a wire. This makes it possible to shorten the transmission between the lower layer (an inner layer copper pattern 34U on the top surface of the core board 30) and an upper first conductor wire 158U formed on the top of the upper layer (the interlaminar resin insulating layer 150), as well as to speed up the signal transmission and reduce the connection resistance. In addition, since the land 61a is connected directly to the pad 61b without using a wire, no stress is concentrated between a wire and a land or between a wire and a pad. The package board is thus protected completely from breaking of a wire caused by a crack generated by concentrated stress at such a place, although the package board manufactured with the prior art technology described above with reference to FIG. 24A has confronted with such a problem.

Although each circularly-formed land is united with a pad in the above embodiment, the land may be formed as an ellipse, a polygon, etc. and united with a pad in this invention.

According to the fourth embodiment described above, each land is connected directly to a pad without using a wire. It is thus possible to shorten the transmission between the lower layer and each conductor wiring (conductor layer) formed in the upper layer, as well as to speed up the signal transmission and reduce the connection resistance. In addition, since each land is connected directly to a pad without using a wire, no stress is concentrated at a junction between wiring and land, as well as at a junction between wiring and pad. The package board can thus be protected completely from breaking of a wire caused by a crack generated by concentrated stress at such a place.

FIFTH EMBODIMENT

Figure 19:
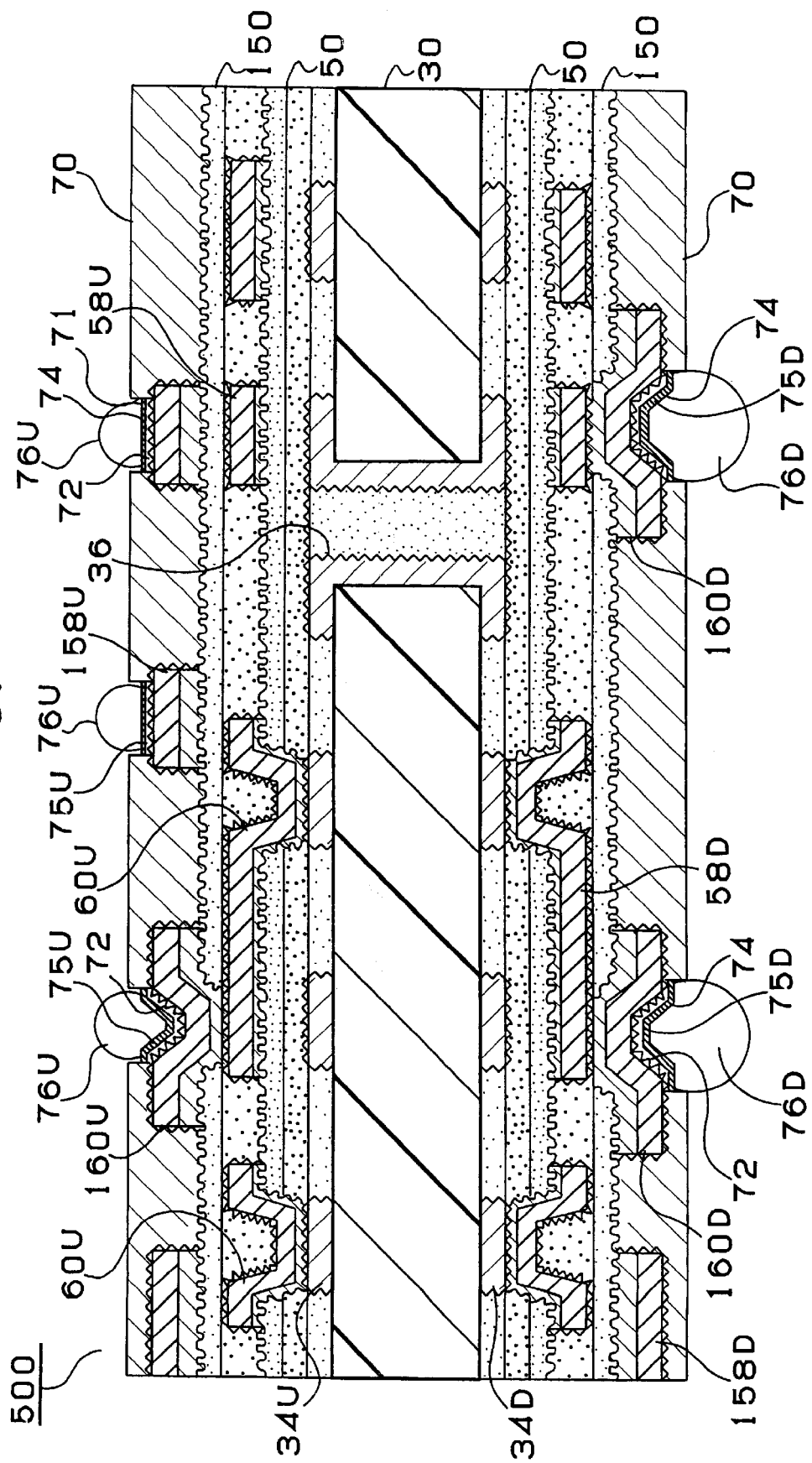
FIG. 19 is a cross sectional view of the package board in a fifth embodiment of the present invention.
Figure 20:
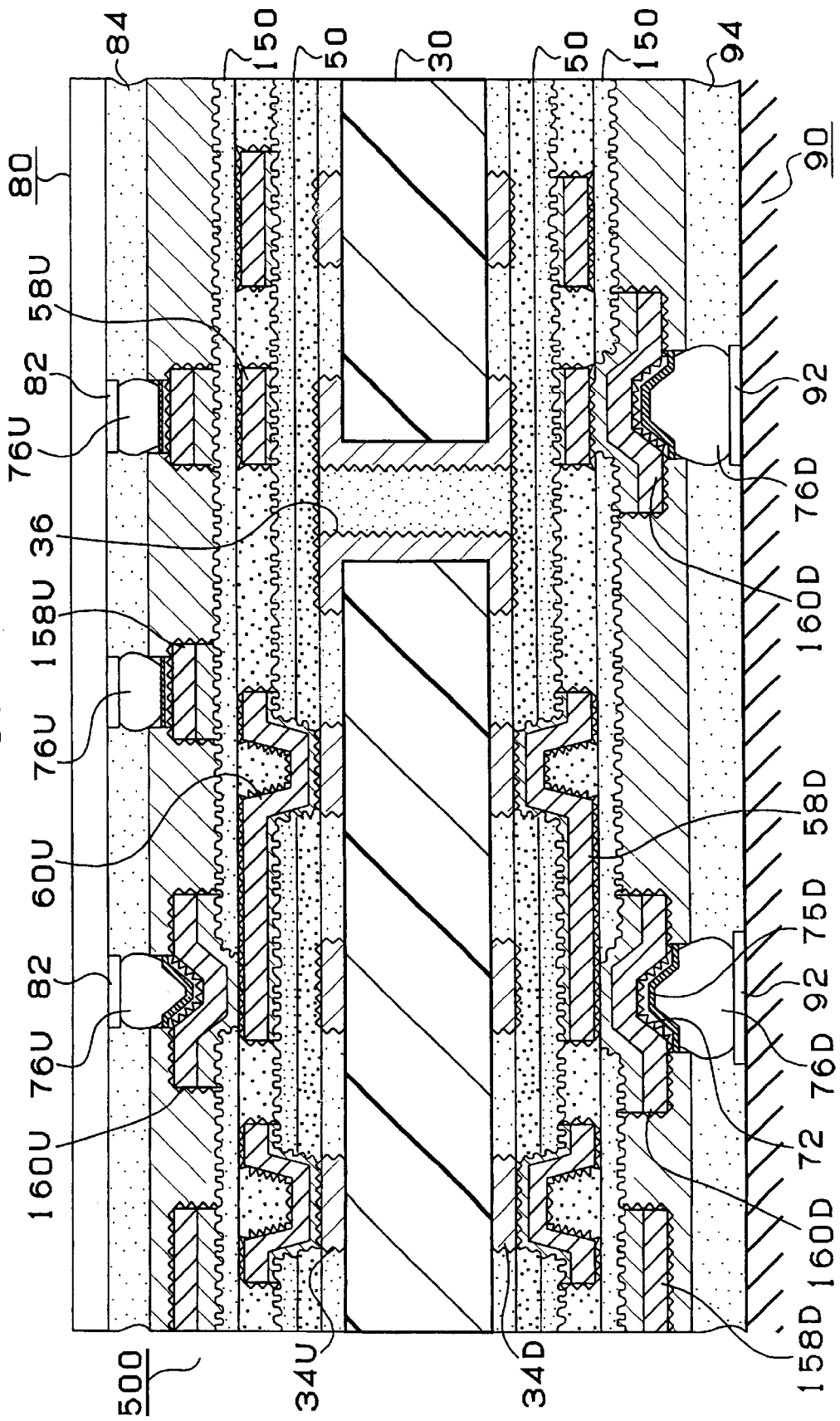
FIG. 20 is a cross sectional view of the package board shown in FIG. 19 when the package board with an IC chip mounted thereon is attached to a mother board.

Hereunder, a description will be made for a configuration of the package board in the fifth embodiment of the present invention with reference to FIGS. 19 and 20. FIG. 19 is a cross sectional view of the package board 500 in the fifth embodiment. FIG. 20 shows how the package board 500 provided with an IC chip 80 mounted on its top surface thereof is mounted on a mother board 90 thereby to compose a so-called integrated circuit package.

On both top and bottom surfaces of the core board 30 of the package board 500 are formed inner layer copper patterns 34U and 34D used as ground layers. In the upper layer of the inner layer copper pattern 34U is formed a conductor circuit 58U forming a signal line with an interlaminar resin insulating layer 50 therebetween, as well as a via-hole 60U through the interlaminar resin insulating layer 50. In the upper layer of the conductor circuit 58U is formed an outermost layer conductor circuit 158U with an interlaminar resin insulating layer 150, as well as a via-hole 160U through the interlaminar resin insulating layer 150. And, a soldering pad 75U for supporting a soldering bump 76U is formed on the conductor circuit 158U and the via-hole 160U respectively. Each of the soldering pads 75U on the IC chip side surface of the package board is formed so as to be 133 to 170 μm in diameter.

On the other hand, in the upper layer of the ground layer (inner layer copper pattern) on the bottom side of the core board 30 is formed a conductor circuit 58D forming a signal line with an interlaminar resin insulating layer 50 therebetween. In the upper layer of the conductor circuit 58D is formed an outermost layer conductor circuit 158D with an interlaminar resin insulating layer 150 therebetween, as well as a via-hole 160D through the interlaminar resin insulating layer 150. And, a soldering pad 75D for supporting a soldering bump 76D is formed in the via-hole 160D. Each of the soldering pads 75D on the mother board side surface is formed so as to be 600 μm in diameter.

According to this package board in the fifth embodiment, a soldering bump 76D is formed on each via-hole 160D on the mother board side surface 60, so that the soldering bump is connected directly to the via-hole. Consequently, the package board is completely protected from breaking of a wire, otherwise to occur between the soldering bump 76D and the via-hole 160D if the package board is cracked. In other words, according to the package board 600 manufactured with the prior art technology described above with reference to FIG. 23B, each soldering pad 375D is connected to a via-hole 360 through a wire 378 and a soldering bump 376D is disposed on a soldering pad 375D. If a crack L2 is generated in the package board 600, therefore, the crack L2 breaks the wire 378 connecting the via-hole 376D to the soldering pad 376D. The soldering bump 376D can therefore be disconnected from the via-hole 360D. On the contrary, according to the package board in the fifth embodiment, no breaking of a wire occurs between the soldering bump 376D and the via-hole 160D even when a crack is generated in the package board.

Next, a description will be made for how the IC chip 80 is mounted on the package board 500 in the fifth embodiment of the present invention shown in FIG. 19. As shown in FIG. 20, the IC chip 80 is mounted on the package board 500 so that the soldering pads 82 of the IC chip 80 are aligned to the soldering bumps 76U of the package board 500. Then, the package board 500 with the IC chip 80 mounted thereon is passed through a heating oven thereby to weld the soldering pads 76U to the soldering pads 82. The IC chip 80 is thus connected to the package board 500.

The package board 500 is then washed to remove the soldering flux seeped out when the soldering bumps 76U are welded to and set up at the soldering pads 82 in the heating process. In this embodiment, an organic solution such as chlorothen is flown between the IC chip 80 and the package board 500 to remove the soldering flux. Resin is then filled between the IC chip 80 and the package board 500 to seal the portion. Although not illustrated, the whole IC chip 80 is molded with resin at this time thereby to finish the mounting of the IC chip 80 on the package board 500.

After this, the soldering pads 92 of the mother board 90 are aligned to the soldering bumps 76D to mount the package board 500 on a mother board 90. Then, the package board is passed through a heating oven to fuse the soldering pads 76D to the soldering pads 92. The package board 500 is then connected to the mother board 90. After this, resin 94 is filled in a clearance between the package board 500 and the mother board 90 as shown in FIG. 20 to seal the clearance. This completes the mounting of the package-:board 500 on the mother board 90.

Figure 21:
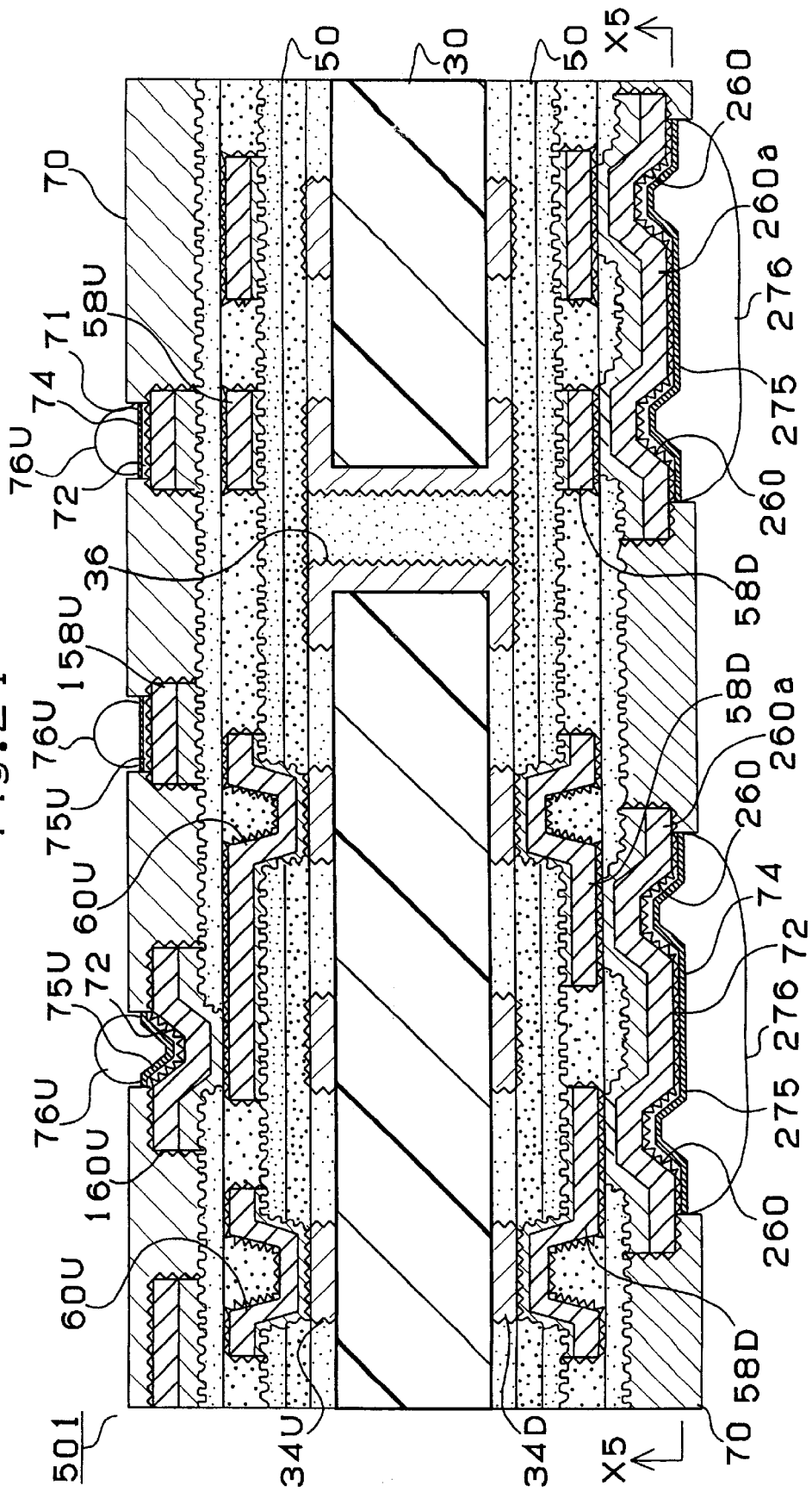
FIG. 21 is a cross sectional view of a package board composed as a variation of the package board in the fifth embodiment of the present invention.

Next, a description will be made for a package board 501 composed as a variation of the fifth embodiment of the present invention with reference to FIGS. 20 and 21.

Figure 22:
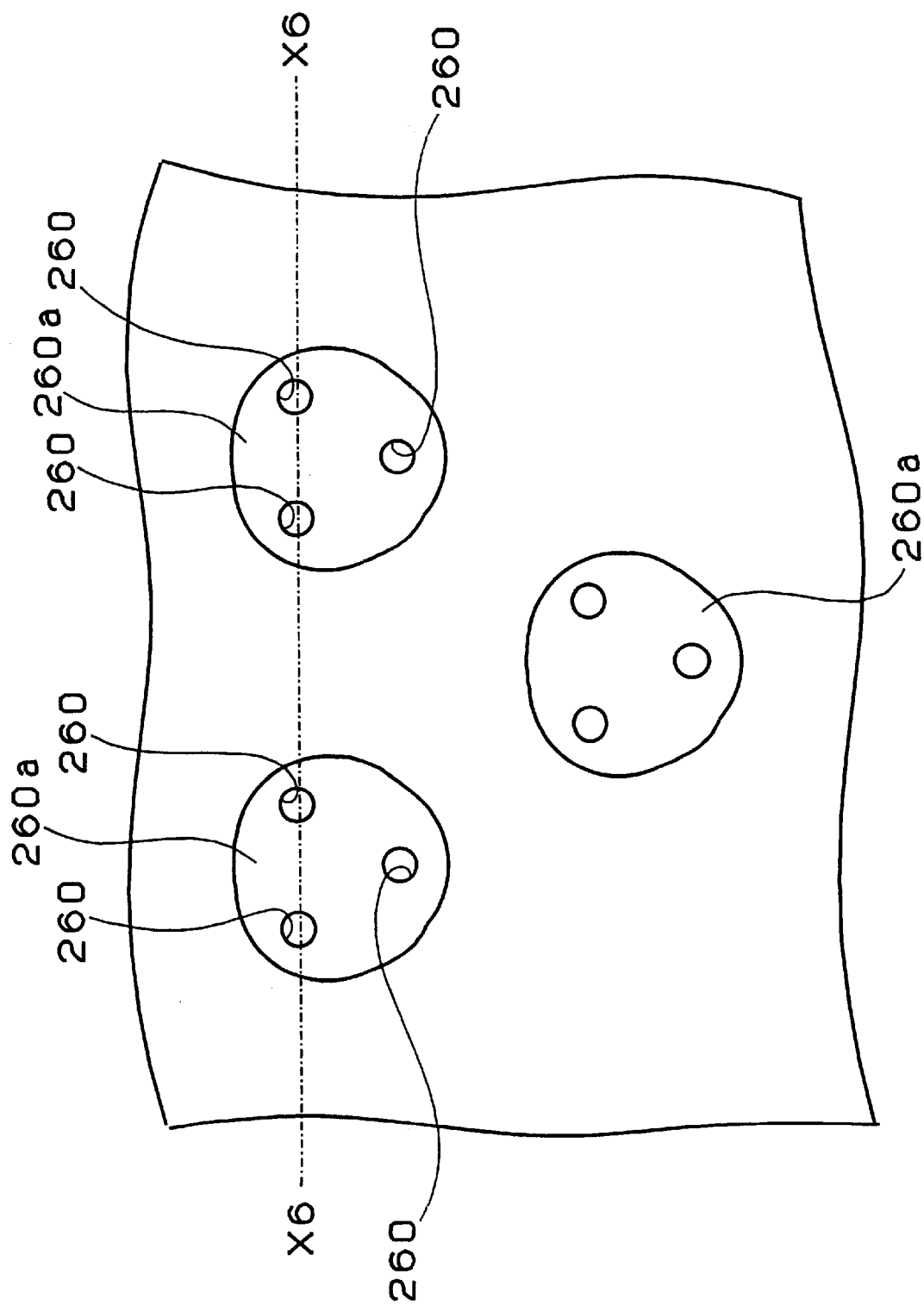
FIG. 22 is an X5—X5 line cross sectional view of the package board shown in FIG. 21.

According to the package board 500 in the fifth embodiment described above with reference to FIG. 19, a soldering bump 76D is formed on a via-hole 160D. Meanwhile, according to the package board 501 in the fifth embodiment, a soldering bump 276 is formed on a plurality of (three) via-holes 260 as shown in FIG. 21. In other words, three via-holes 260 are formed closely to each other as shown in FIG. 22, which is equal to the X5—X5 line cross sectional view shown in FIG. 21 (the X6—X6 line in FIG. 22 is equal to the X5—X5 line in FIG. 21). Then, a nickel plated layer 72 and a gold plated layer 74 are formed respectively on a common land 260*a* of the three via-holes 260 thereby to form one large land 275. And, a large soldering bump 276 is formed on the large land 275.

In the case of this package board 501 composed as a variation of the fifth embodiment, a soldering bump 276 is formed on a plurality of via-holes 260, so that the soldering bump 276 is connected directly to the via-holes 260. Consequently, it is prevented that the soldering bump 276 is disconnected from the via-holes 260, for example, even when the package board 501 is cracked. In addition, since a soldering bump 276 is formed on a plurality of (three) via-holes 260, the package board 501 can have a phase safe function. Because, when one of those via-holes 260 is disconnected from the inner layer conductor circuit 58D, another via-hole 260 can keep the connection with the soldering bump 27 and the inner layer conductor circuit 58D.

Furthermore, as described above, each soldering pad 75U on the IC chip 80 side surface is formed so as to be 133 to 170 μm in diameter and each soldering pad 75D on the mother board side surface is formed so as to be 600 μm in diameter. Thus, there is generated a difference in soldering pad size 4 to 5 times between the IC chip side and-the mother board side. It is thus difficult to form a large soldering pad 75D on a via-hole like those formed on the mother board side surface. In the case of this package board 501 composed as a variation of the fifth embodiment, therefore, a soldering bump 276 is formed on a plurality of (three) via-holes 260, 260, and 260 thereby to form such a large soldering bump. Although one soldering bump is formed on three via-holes in this variation described above, it is also possible to form one soldering bump on two via-holes or on four or more via-holes.

According to the package board in the fifth embodiment as described above, a soldering bump is formed on a via-hole, so that the soldering bump is connected directly to the via-hole. This can prevent breaking of a wire even when the package board is cracked between the soldering bump and the via-hole. In addition, since a soldering bump is formed on a plurality of via-holes, the package board can have a phase safe function. Because, when one of the via-holes is disconnected from the soldering bump inside the package board, another via-hole can keep the connection with the soldering bump. And, since a soldering bump is formed on a plurality of via-holes, the soldering bump can be formed larger with respect to the via-hole.

Although the package board is connected directly to the mother board in the embodiment described above, the present invention also allows the package board to be connected to the mother board via a sub-board, etc.

What is claimed is:

1. A package board comprising:
   a core board, the core board having an IC chip side surface and an other surface opposed to the IC chip side surface;
   a first plurality of conductor circuits formed on the IC chip side surface and a second plurality of conductor circuits formed on the other surface, the first plurality of conductor circuits being constructed and adapted to be electrically connected to an IC chip;
   a first interlaminar resin insulating layer disposed between the IC chip side surface and the first plurality of conductor circuits;
   a second interlaminar resin insulating layer disposed between the other surface and the second plurality of conductor circuits;
   a first plurality of soldering pads formed on the IC chip side surface;
   a second plurality of soldering pads formed on the other surface, the soldering pads of the second plurality being larger than the soldering pads of the first plurality; and
   a dummy pattern constructed and adapted to improve the mechanical strength of the package board, the dummy pattern being formed at an outer periphery of the first plurality of conductor circuits.

2. A package board, comprising:
   a core board, the core board having an IC chip side surface and an other surface opposed to the IC chip side surface;
   one or more layers of conductor circuits formed on the IC chip side surface and one or more layers of conductor circuits formed on the other surface, the one or more layers of conductor circuits formed on the IC chip side surface being constructed and adapted to be electrically connected to an IC chip;
   a first interlaminar resin insulating layer disposed between the core board and the one or more layers of conductor circuits formed on the IC chip side surface;
   a second interlaminar resin insulating layer disposed between the core board and the one or more layers of conductor circuits formed on the other surface;
   additional interlaminar insulating layers disposed between ones of the one or more layers of conductor circuits formed on the IC chip side surface and the other surface;
   a first plurality of soldering pads formed on a top one of the one or more layers of conductor circuits on the IC chip side surface;

a second plurality of soldering pads formed on a top one of the one or more layers of conductor circuits on the other surface, the soldering pads of the second plurality being larger than the soldering pads of the first plurality; and a dummy pattern constructed and adapted to improve the mechanical strength of the package board, the dummy pattern being formed at an outer periphery of at least one of the one or more layers of conductor circuits on the IC chip side surface.

3. The package board of claim 1, wherein the dummy pattern is formed at the outer periphery of each of the one or more layers of conductor circuits on the IC chip side surface.

4. A package board, comprising:

a core board, the core board having an IC chip side surface and an other surface opposed to the IC chip side surface;

one or more layers of conductor circuits formed on the IC chip side surface and one or more layers of conductor circuits formed on the other surface, the one or more layers of conductor circuits formed on the IC chip side surface being constructed and adapted to be electrically connected to an IC chip;

a first interlaminar resin insulating layer disposed between the core board and the one or more layers of conductor circuits formed on the IC chip side surface;

a second interlaminar resin insulating layer disposed between the core board and the one or more layers of conductor circuits formed on the other surface;

additional interlaminar insulating layers disposed between ones of the one or more layers of conductor circuits formed on the IC chip side surface and the other surface;

a first plurality of soldering pads formed on a top one of the one or more layers of conductor circuits on the IC chip side surface;

a second plurality of soldering pads formed on a top one of the one or more layers of conductor circuits on the other surface, the soldering pads of the second plurality being larger than the soldering pads of the first plurality; and a dummy pattern constructed and adapted to improve the mechanical strength of the package board, the dummy pattern being formed at an outer periphery of the core board on the IC chip side surface.

* * * * *